United States Patent
Chung et al.

(10) Patent No.: US 8,321,768 B2
(45) Date of Patent: Nov. 27, 2012

(54) METHOD AND SYSTEM FOR CALCULATING CRC

(75) Inventors: Shen-Ming Chung, Hsinchu (TW);
Jun-Yao Wang, Hsinchu (TW);
Hsiao-Hui Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1273 days.

(21) Appl. No.: 12/061,713

(22) Filed: Apr. 3, 2008

(65) Prior Publication Data
US 2008/0250297 A1 Oct. 9, 2008

(30) Foreign Application Priority Data
Apr. 3, 2007 (TW) ................. 96111734 A

(51) Int. Cl.
*G06F 11/00* (2006.01)

(52) U.S. Cl. ...................................... 714/781
(58) Field of Classification Search .................. 714/781, 714/758; 708/530
See application file for complete search history.

(56) References Cited

U.S. PATENT DOCUMENTS

| | | | | |
|---|---|---|---|---|
| 6,766,493 | B1 * | 7/2004 | Hoffman et al. | 714/785 |
| 6,904,558 | B2 | 6/2005 | Cavanna et al. | |
| RE40,684 | E * | 3/2009 | Keller | 714/757 |
| 2003/0023921 | A1 * | 1/2003 | Collier et al. | 714/758 |
| 2003/0167440 | A1 | 9/2003 | Cavanna et al. | |
| 2004/0205441 | A1 * | 10/2004 | Oren | 714/758 |
| 2006/0009952 | A1 | 1/2006 | Anderson et al. | |
| 2006/0067365 | A1 * | 3/2006 | Venkataramana et al. | 370/474 |
| 2006/0114909 | A1 | 6/2006 | Uzrad-Nali et al. | |
| 2007/0162823 | A1 * | 7/2007 | Lin et al. | 714/758 |

FOREIGN PATENT DOCUMENTS
WO   WO 03/084078 A1   10/2003
* cited by examiner

*Primary Examiner* — Scott Baderman
*Assistant Examiner* — Yair Leibovich
(74) *Attorney, Agent, or Firm* — Volentine & Whitt, PLLC

(57) ABSTRACT

In a method and system for calculating CRC, a Partial CRC is first calculated directly according to a segment of a message. Then, a First Code including the Partial CRC appended with a plurality of zero-bytes is generated. Finally, the Adjusted CRC is calculated according to the First Code. Therefore, an Adjusted CRC can be derived directly from each segment of a message. After all segments of a message are received, all the derived Adjusted CRCs are merged to obtain a Final CRC of the message. The method and system can be quickly prototyped and implemented to various systems due to its simplicity.

31 Claims, 26 Drawing Sheets

First Memory

Second Memory

METHOD AND SYSTEM FOR CALCULATING CRC

BACKGROUND OF THE INVENTION

1. Field of the Invention

The present invention relates to a method and system for calculating CRC (Cyclic Redundancy Check).

2. Description of the Related Art

"Cyclic Redundancy Check", abbreviated by CRC in the follows, due to its adequate easy implementation for encoding and decoding, and its stronger, powerful error detecting ability, it becomes the most common checking code on the current computer network. The usual application is archiving, disk controller, Ethernet and iSCSI, etc. The present computer network commonly utilizes CRC tech accompanied with re-sent mechanism to confirm the datum correctness.

In some network application, for example, iSCSI (Internet Small Computer System Interface) layer will add wanted sending data with its respective CRC codes to form one message (message, or called by Protocol Data Unit: PDU) and then assign it to the transmitting end of TCP/IP layer. The TCP/IP transmitting end will slice the iSCSI message into some segments and send them out according to the maximum segment size (MSS) committed with the TCP/IP receiving end. When TCP/IP receiving end receives segments, it firstly stores them in the Memory, and after all segments of iSCSI messages are collected completely, assigns the iSCSI messages to iSCSI layer of the receiving end for CRC. Afterward, the iSCSI of the receiving end must read the iSCSI messages from the Memory to conduct CRC computation. In the example, CRC computation can only be conducted after all segments of iSCSI messages are collected completely, hence a delay time resulted. Furthermore, to conduct CRC computation, the iSCSI receiver must read messages from the Memory and consequently add loads to the Memory bus and impact the system performance. The above is the first conventional CRC method.

In the second conventional CRC, CRC is calculated immediately as each segment is received in the receiving end, and computed intermediate results are accumulated in the receiving logic. As successor segments are received, the successor segments and the intermediate result are calculated continuously. By this way, after all segments are received, the intermediate result of the receiving logic is the final CRC result. The second conventional method can refer to US Pub. No. US2006/114909, the second conventional method may avoid a longer delay and extra Memory accessing. Because the current network packet routing usually apply to uninsured sequential principle (like IP protocol), so its applicability can be greatly reduced. Additionally, for the aspect of each network connection management in the second conventional method, as the number of connections gets more, the design complexity will increase tremendously, it will eclipse the implementation.

In the third conventional CRC method, CRC is calculated immediately as each segment is received so as to obtain a partial CRC. The partial CRC can be adjusted to obtain its corresponding CRC of sub-message. After each CRC of sub-messages is computed, all the CRCs are merged to obtain the final CRC result. The third conventional method can refer to PCT (patent cooperated treatment) WO03/084078, US patent No. U.S. Pat. No. 6,904,558, US Pub. No. US2003/0167440 and US Pub. No. US2006/0009952. It targets mainly on modulo function characteristic for decomposing, and utilizes the finite field multiplication with table looking up to adjust CRC of sub-message.

SUMMARY OF THE INVENTION

An exemplary example of the invention provides a method for calculating CRC, comprising the steps of: calculating a partial CRC from a segment of a message; generating a First Code, the First Code comprising the partial CRC, other bits of the First Code set to zero; and calculating Adjusted CRC according to the First Code.

An exemplary example of the invention provides a system for calculating CRC, comprising: a First Calculating Device, a First Code generating device and a Second Calculating Device. The First Calculating Device is used for calculating a partial CRC from a segment of a message. The First Code generating device is used for generating a First Code. The said First Code comprises the partial CRC with other bits set to zero. The Second Calculating Device is used for calculating Adjusted CRC according to the First Code.

Using the system and the method of the invention, receiver directly calculates CRC of the segment and gets Adjusted CRC as receiving each segment of a message. After all segments of sub-messages are received, the Adjusted CRCs are merged to obtain the final CRC result. Because the Second Calculating Device can be implemented by many table-looking-up methods, the system and method of the invention can be verified, implemented swiftly in many system.

DETAILED DESCRIPTION OF THE INVENTION

Figure 1:
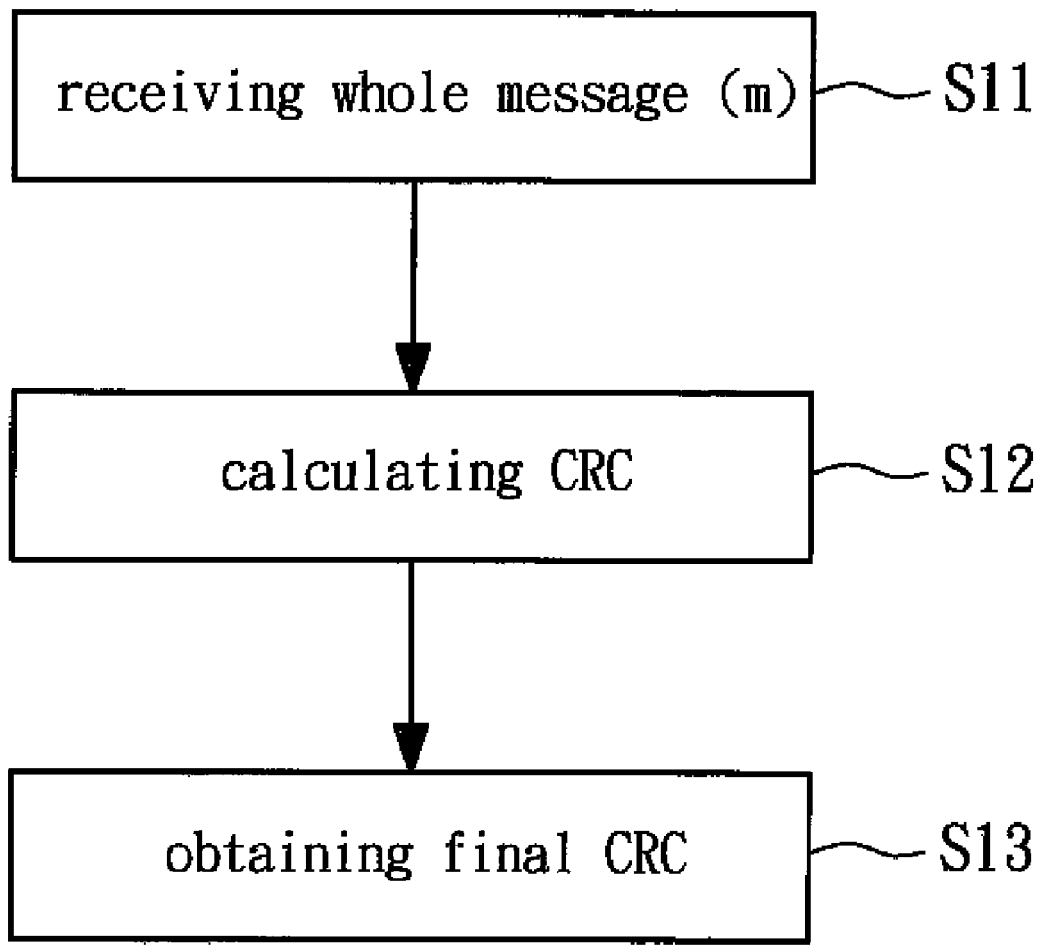
FIG. 1 is a flow chart of the conventional calculating CRC method.

Conventionally, the CRC calculation is directly obtained by polynomial division.

Firstly, each bit of the binomial expression of a transmitting data, from the most significant bit to the least significant bit, is treated as the coefficient of a polynomial $d(x)$ from the most significant power to least significant power respectively. Hence the coefficient of $d(x)$ is either 1 or 0, which is equal to elements of finite field $GF(2)$.

Then by the requirement of error detection capability of target application, a generating polynomial $g(x)$ with power degree of m is referred.

Finally, after $d(x)$ is multiplied with $x^m$ and divided by $g(x)$, a remainder polynomial $r(x)$ can be obtained as shown in equation (1). The coefficients of the remainder polynomial are defined as the CRC of the transmitting data.

$$d(x) \times x^m = c(x) \times g(x) + r(x) \qquad (1)$$

Because under the finite field $GF(2)$, the addition operation is equal to the subtraction operation, hence the equation 2 can be derived from equation 1.

$$d(x) \times x^m + r(x) = c(x) \times g(x) \qquad (2)$$

Since the left side of equation (2) equals multiples of $g(x)$ and each CRC codeword is defined to be multiples of $g(x)$, the transmitting end can form a CRC codeword by simply concatenating the transmitting data with the CRC of the transmitting data. The formed CRC codeword can then be transmitted over certain communication channel.

By the definition of CRC codeword, the receiving end can examine the correctness of the received data by simply checking whether the received data is multiples of $g(x)$ or not. if the received data is multiples of $g(x)$, the receiving end will assume the received data is correct.

Since the manipulation of the above equations, i.e. long polynomial division, can be simply implemented by Linear Feedback Shift Registers (LFSR) in both encoding phase and decoding phase, the conventional method is easy to be implemented. However, its efficiency is seriously questioned. For example, as the CRC encoding/decoding is applied to Internet applications, since messages comprising with CRC are usually needed to be transmitted over other Internet protocols, like TCP/IP, it will be sliced into a number of segments before being sent out if the message is bigger then the size of Maximum Segment Size (MSS). Therefore, applications of the conventional receiving end will wait for the TCP/IP protocol to receive all segments of a message before conducting the above long polynomial division. This phenomenon occurs in many applications. In the example of iSCSI, the transmitting end of iSCSI usually accumulates message data until some mount between 8 KB to 14 KB before launching CRC encoding. Since the transmission of iSCSI is usually over TCP/IP and the TCP will slice the encoded message into TCP segments smaller than 1.5 KB before transmitting, the conventional CRC decoding can only be conducted after all TCP segments of a message are received. Therefore, nothing can be done during the period of segment receiving. Additionally, after all TCP segments of a message are received into the Memory of receiving end, the afterward CRC decoding must still read the messages from the Memory. Such accessing adds extra loads to the Memory bus and consequently impact system performance.

To avoid the above problems, the linearity characteristics of CRC can be applied to allow each segments to be pre-processed before all segments of a message are received. And after all segments of a message are received, all the pre-processed results are adjusted and then merged into the CRC of the received message.

Referring to FIG. 1, a conventional CRC calculating method firstly receives whole m (message), as shown in step S11. Then the CRC of the message is calculated, as shown in step S12. The calculated CRC is called the final CRC, as shown in step S13.

Figure 2:
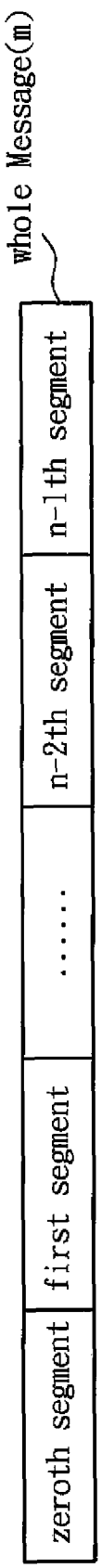
FIG. 2 is the schematic view of whole message slicing into a plurality of segments.

As discussed above, since the message size of many Internet applications is bigger than the MSS (Maximum Segment Size) of the transport layer, the messages will be sliced into a number of segments before being sent out. As shown in FIG. 2, a message m is sliced into a plurality of segments, for example, the message is sliced into n segments, which are labeled as zeroed segment, first segment, . . . , n−2th segment and n−1th segment.

By equation (3), the definition of sub-messages of a message m is introduced. As stated in equation (3), by bitwise-XORing all the sub-message, the message m can be composed.

$$m = sm_0 \oplus sm_1 \oplus \ldots \oplus sm_{n-2} \oplus sm_{n-1} \qquad (3)$$

Wherein $\oplus$ is the bitwise-XOR calculation.

Figure 3:
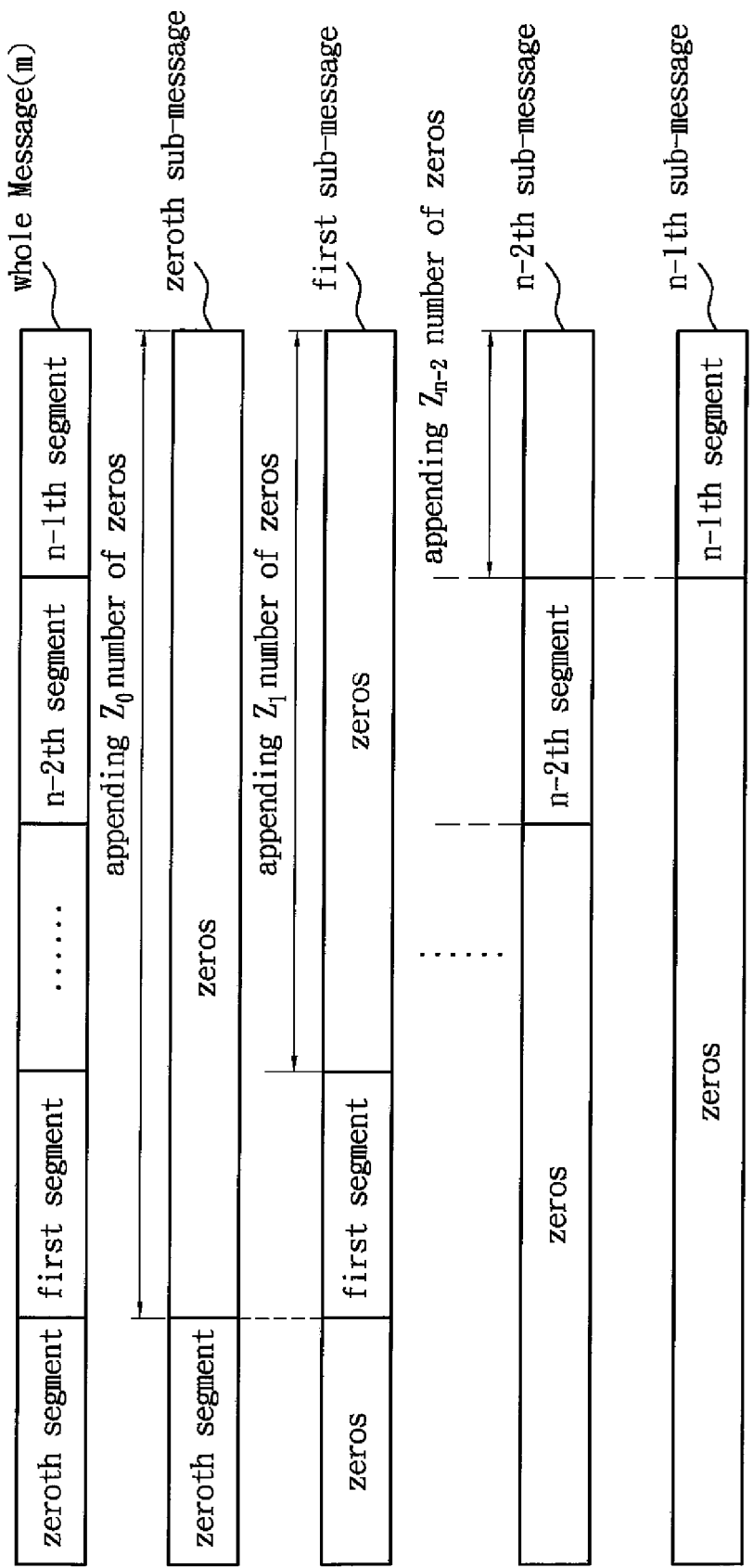
FIG. 3 is the schematic view of a plurality of sub-messages.

Referring to FIG. 3, by appending appropriate number of zeros to each segment of a message m, a set of sub-message, i.e. $sm_i$ where $i=0 \sim (n-1)$, of a message m can be formed. For example: the sub-message $sm_k$, where $k=0 \sim (n-1)$, can be formed by concatenating $segment_k$ with $z_k$ zeros, where $z_k$ is the total length of segments with $k < j < n$.

Because CRC calculation satisfies the characteristic of linear transformation, hence the equation (4) can be derived from equation (3).

$$\begin{aligned} CRC(m) &= CRC(sm_0 \oplus sm_1 \oplus \ldots \oplus sm_{n-2} \oplus sm_{n-1}) \\ &= CRC(sm_0) \oplus CRC(sm_1) \oplus \ldots \oplus \\ & \quad CRC(sm_{n-2}) \oplus CRC(sm_{n-1}) \end{aligned} \qquad (4)$$

As stated in equation (4), the CRC of the message m is equal to the result of bitwise-XORing all the CRCs separately calculated from each sub-messages. That is, the bitwise-XOR operation merges all the CRCs of a set of sub-messages into the CRC of their corresponding message. Due to the characteristic, as receiving each segment of a message, a corresponding sub-message can be derived and the CRC of the derived sub-message can be calculated and temporarily stored for latter merging . . . . Besides, since bitwise-XOR operation is commutative, the order of calculating CRC of each sub-message does not influence the result of merging.

In the invention, the CRC of sub-message is called the Adjusted-CRC. Based on the above explanation, referring to FIG. 4, proceeding CRC calculation respectively to sub-message can calculate Adjusted-CRC, finally using bitwise-XOR calculation to merge Adjusted-CRC of each sub-message so as to obtain CRC of the original message, which is called the Final CRC in this patent.

Figure 4:
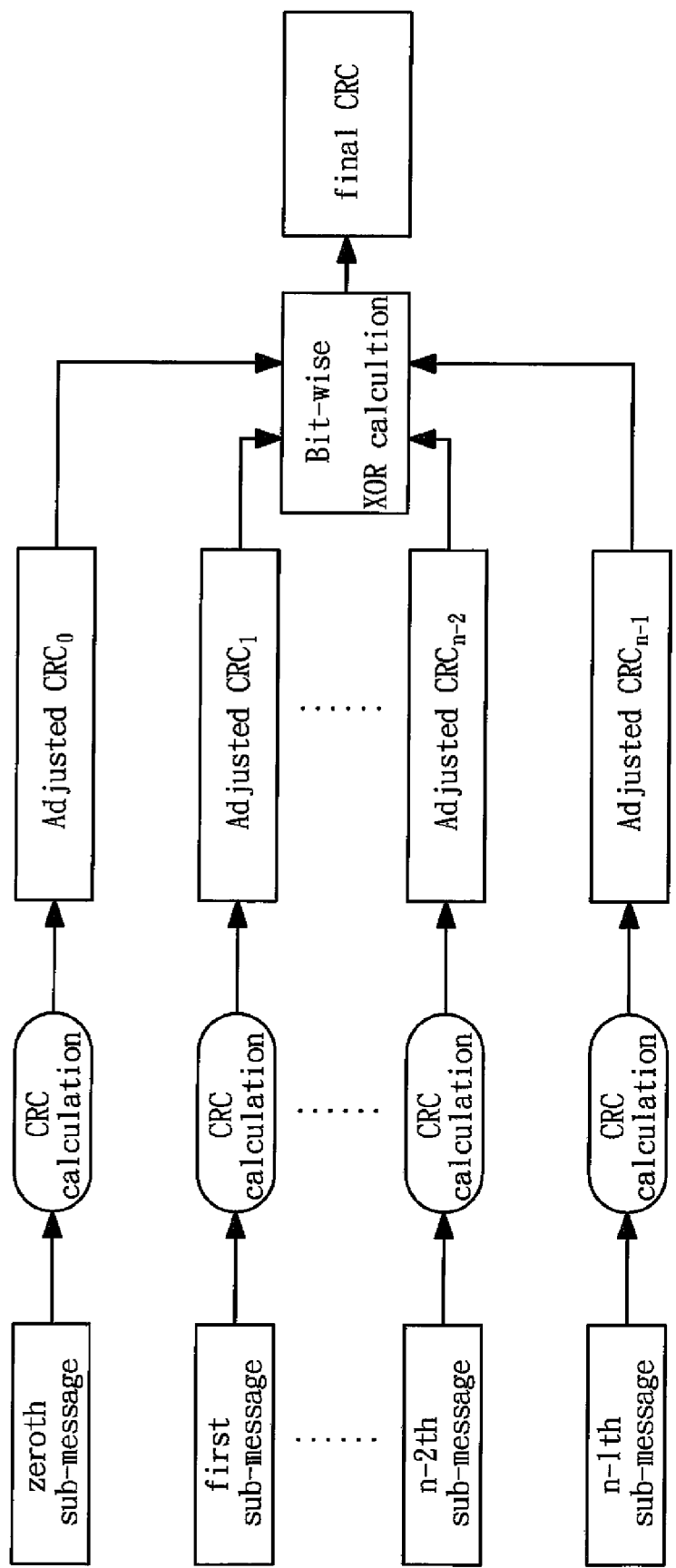
FIG. 4 is the schematic view of showing that CRC calculations proceed according to a plurality of sub-messages respectively.
Figure 5:
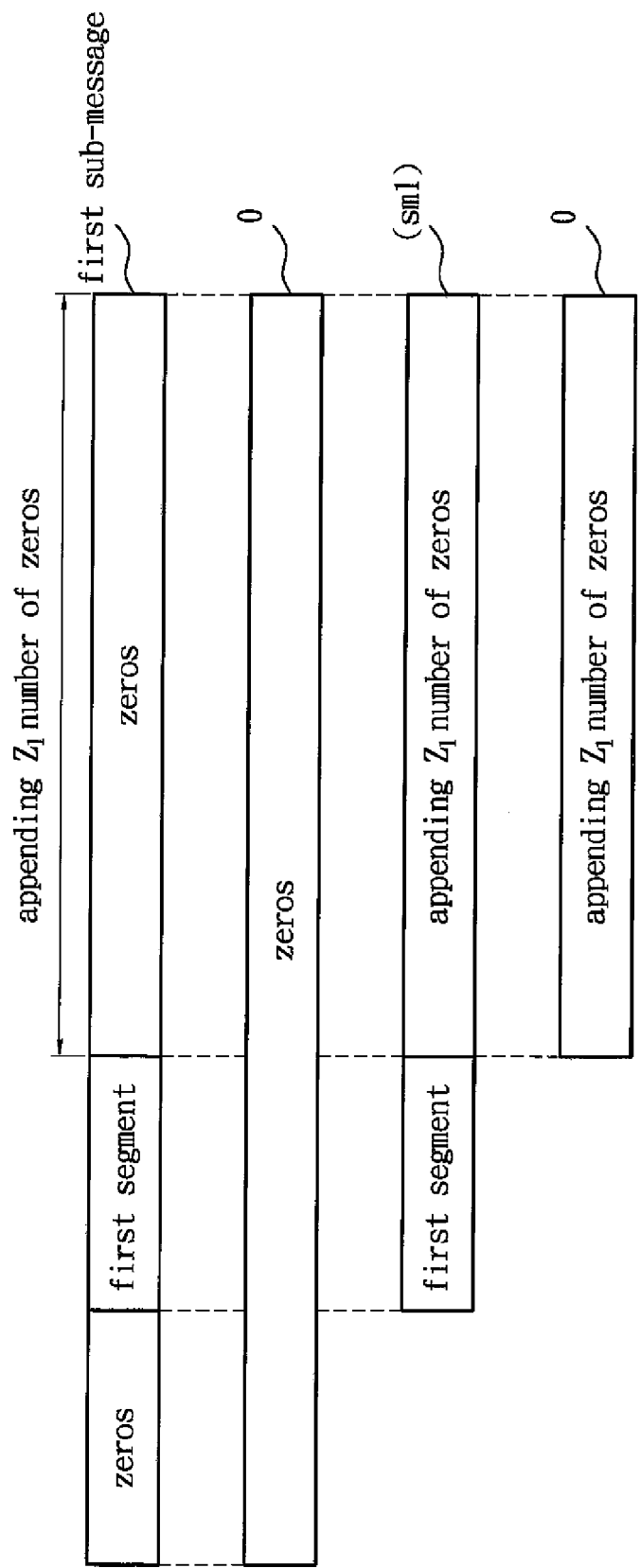
FIG. 5 is the schematic view of showing that a first sub-message can be treated equally as three operands merged by the bitwise-XOR operation.

Based on equation (4) and FIG. 4, during receiving segments, simply appending correct number of zeros to each segment can obtain a corresponding sub-message. For this reason, the calculation of Adjusted-CRC can be performed before all segments are received. By equation (5) and FIG. 5, further explanations are given. In FIG. 5 the first sub-message, which is derived from segment 1, is taken as an example. The first sub-message can be treated as three messages merged by bitwise-XOR operation as equation (5). Thus, conducting CRC calculation to the first sub-message, i.e. $sm_1$, equals to conducting CRC calculation to $sm_1'$ which can be simply formed by appending appropriate number of zeros to the tail of the first segment.

$$CRC(sm_1) = CRC(0 \oplus sm_1' \oplus 0) \quad (5)$$
$$= CRC(0) \oplus CRC(sm_1') \oplus CRC(0)$$
$$= 0 \oplus CRC(sm_1') \oplus 0$$
$$= CRC(sm_1')$$

Based on equation (5), during receiving a segment, the segment can be appended by appropriate number of zeros and then be processed by any kind of CRC circuit, such as the LFSR, to get the Adjusted-CRC.

Although LFSR can be simply utilized to get the Adjusted-CRC based on the above derivation, its processing speed may not keep pace with packet receiving speed, especially in a high speed network environment. Since the LFSR must process through the whole sub-message word by word (one word is usually 8-bit, 16-bit or 32-bit long), if the appended zeros is too lengthy, its processing speed is likely not enough to keep pace with the packet receiving speed. That is, if the LFSR cannot complete it calculation on a sub-message before the successor segment comes, the successor segment may be broken or lost due to limited queuing resource. In order to speed up the CRC calculation speed over the sub-message with lengthy zeros, here a sequence of derivation is given to show up some important characteristic of CRC calculation over the case.

Because CRC calculation is a calculation of long division to obtain the remainder, supposing a message (msg) has binomial expression represented in form of a polynomial msg(x), the CRC calculation is defined as equation (6):

$$CRC(msg) = (msg(x) \times x^m) \bmod g(x) \quad (6)$$

Equation (7) can derived from of equation (5) based on equation (6).

$$CRC(sm1') = (sm1'(x) \times x^m) \bmod g(x) \quad (7)$$
$$= (seg_1(x) \times x^{z1} \times x^m) \bmod g(x)$$
$$= (seg_1(x) \times x^m \times x^{z1}) \bmod g(x)$$
$$= (((seg_1(x) \times x^m \bmod g(x)) \times$$
$$(x^{z1} \bmod g(x))) \bmod g(x)$$

Because by equation (6), $(seg_1(x) \times x^m) \bmod g(x)$ states for conducting the CRC calculation over segment 1 ($seg_1$), if the result of $(seg_1(x) \times x^m) \bmod g(x)$ is $crc_1(x)$, then equation (7) can be rewritten and derived in equation (8).

$$CRC(sm_1') = (crc_1(x) \times (x^{z1} \bmod g(x))) \bmod g(x) \quad (8)$$
$$= ((crc_1(x) \bmod g(x)) \times (x^{z1} \bmod g(x))) \bmod g(x)$$
$$= (crc_1(x) \times x^{z1}) \bmod g(x)$$
$$= (crc_1(x) \times x^{z1-m} \times x^m) \bmod g(x)$$
$$= (crc_1(x) \times x^{z1a} \times x^m) \bmod g(x)$$
$$= CRC(crc1\_pad\_z1a)$$

Wherein $z_{1a}=z_1-m$, and crc1_pad_z1a is the data formed from appending $z_{1a}$ number of zeros after crc1.

Figure 6A:
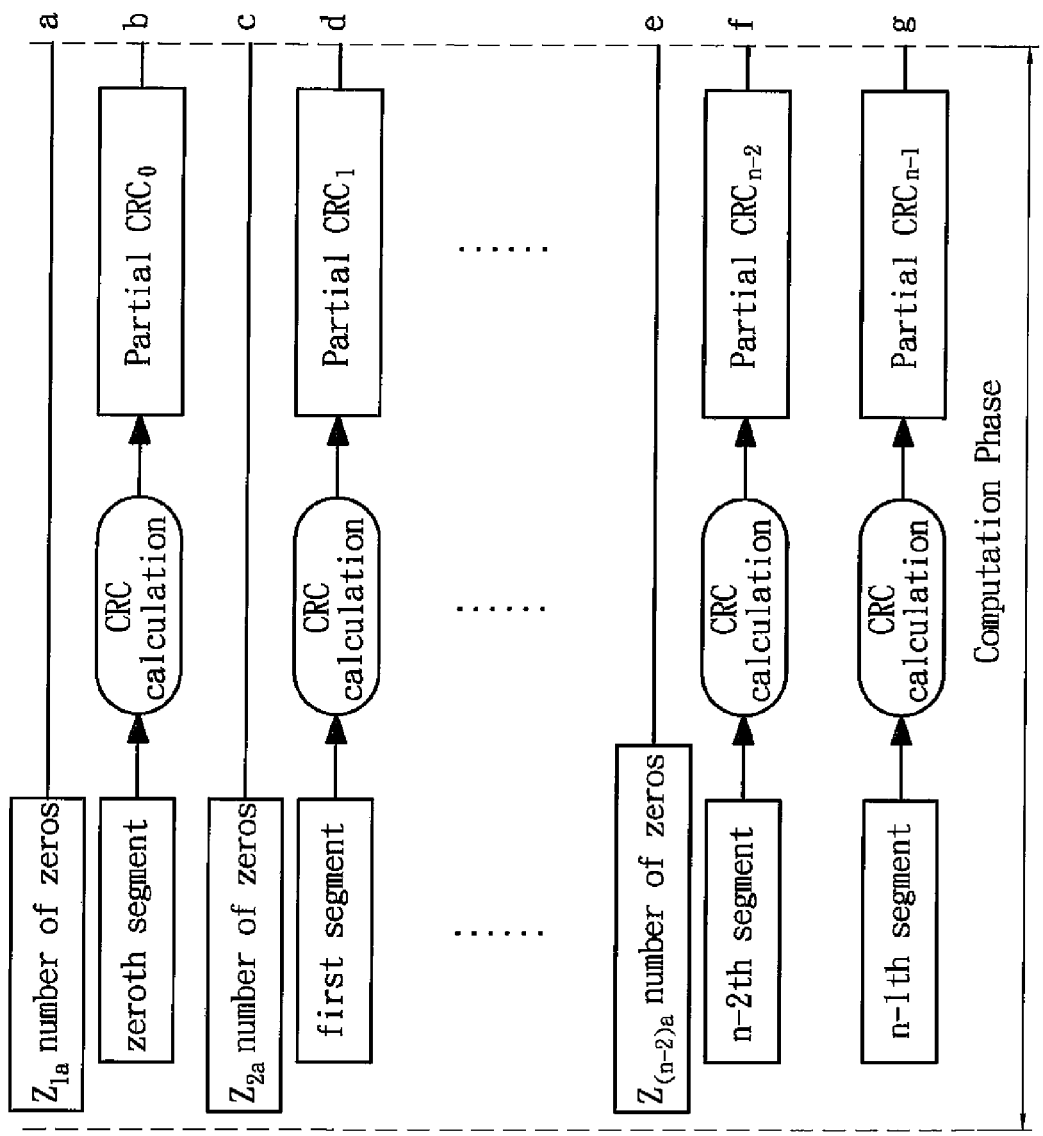
FIGS. 6A and 6B are the schematic views of calculating CRC method according to the invention.
Figure 6B:
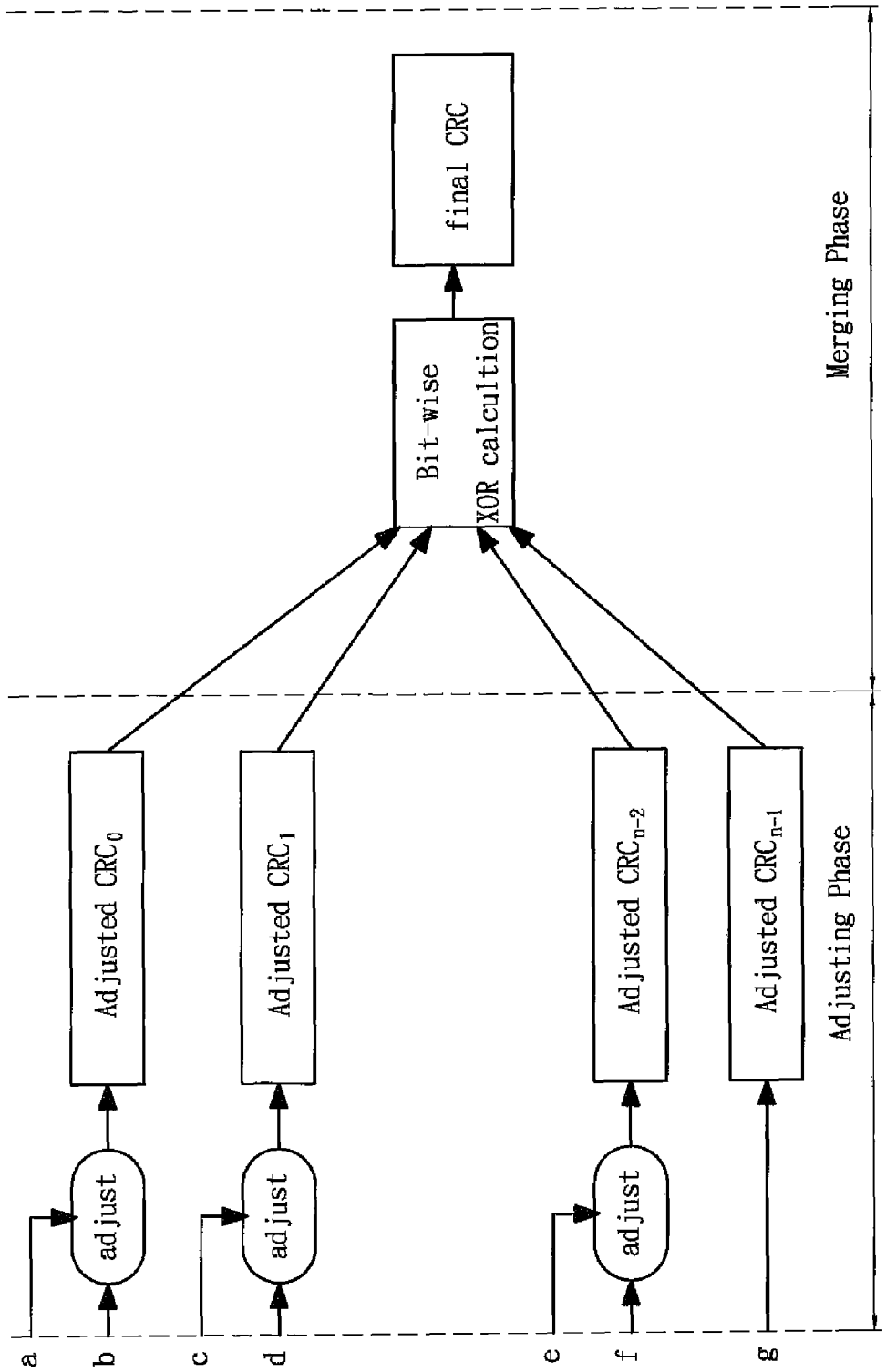

Based on the above derivation, FIGS. 6A and 6B are given according to the CRC calculating method of this invention. In FIGS. 6A and 6B, firstly each segment of a message is calculated to obtain a corresponding partial CRC so as to complete a phase called the Computation Phase in this specification. During this phase, there is no need to calculate CRC for whole message.

Then a phase called the Adjusting Phase is conducted. During this phase a First Code is generated from the partial CRC calculated from the Computation Phase by appending appropriate number of zeros (like $z_{1a}$ in equation (8)) to the partial CRC., Then the Adjusted-CRC of the sub-message is calculated from the First Code by any CRC method as stated in equation (8).

Figure 7:
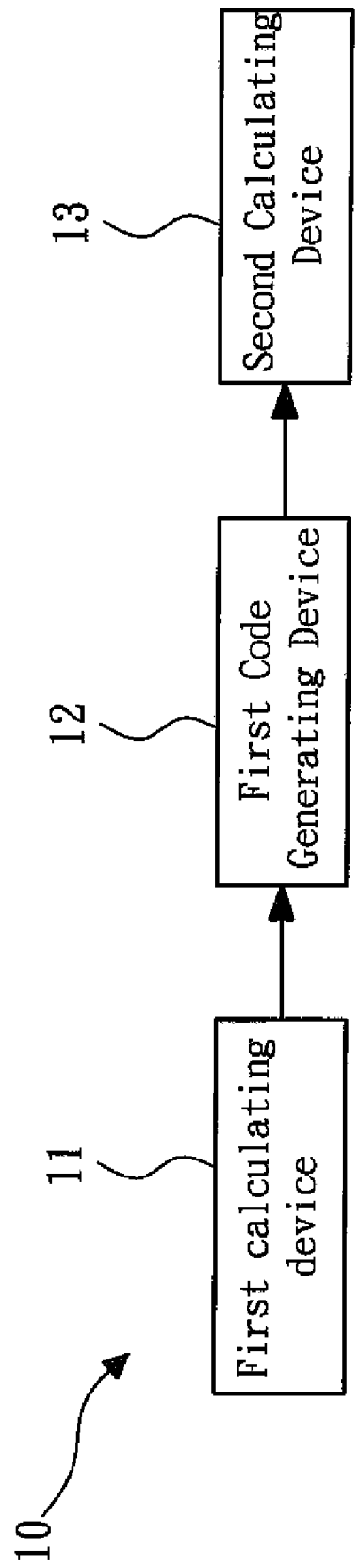
FIG. 7 is the schematic view of the calculating CRC system according to the invention.

Referred to FIG. 7, it shows the schematic view of CRC calculating system of the invention. The CRC calculating system 10 comprises: a First Calculating Device 11, a First Code generating device 12 and a Second Calculating Device 13. The First Calculating Device 11 is used for calculating a partial CRC from a segment of a message. The First Code generating device 12 is used for generating a First Code. The First Code comprises the partial CRC appended with appropriate length of zeros, wherein the length is calculated as $z_{1a}$ in equation (8).

The Second Calculating Device 13 is used to generate Adjusted CRC from the First Code. According to equation (8), the Second Calculating Device 13 can use any CRC method to do the generation.

Referred to FIG. 6A and FIG. 6B, when the Adjusted CRC of each received segment has been calculated, the bitwise-XOR calculation is used to merge the AAdjusted CRCs of all the sub-messages so as to obtain the Final CRC of the whole message. The phase is merging phase. Hence for CRC calculation of the whole message, the method of the invention can be classified into Computation Phase, Adjusting Phase and Merging Phase.

As discussed above, using traditional LFSR implementation to generate Adjusted CRC from each sub-message usually takes inapplicable long time due to the lengthy appended zeros. However, since this invention divides the generation of Adjusted CRC into two phases, each phase can utilize difference CRC implementation to speed up the generation. For example, LFSR implementation is sufficient for the Computation Phase, but for the Adjusting Phase, certain efficient implementation can further be derived from the characteristic of First Code to keep pace with high speed network environment. Following the embodiments of the Adjusting Phase are derived and revealed from the table look-up implementation of CRC calculation. Such implementations currently usually process data with throughput rate ranging from 8-bit to 32-bit per clock cycle. The invention takes the implementation with throughput rate of 8-bit as an example to propose further detailed adjusting method and explains them through the following three embodiments for the Adjusting Phase.

Because currently most CRC applications apply 32-bit CRC, i.e. taking g(x) with m=31, the following three embodiments will explain how to adjust Partial CRC to Adjusted CRC based on 32-bit CRC.

The First Embodiment

Figure 8:
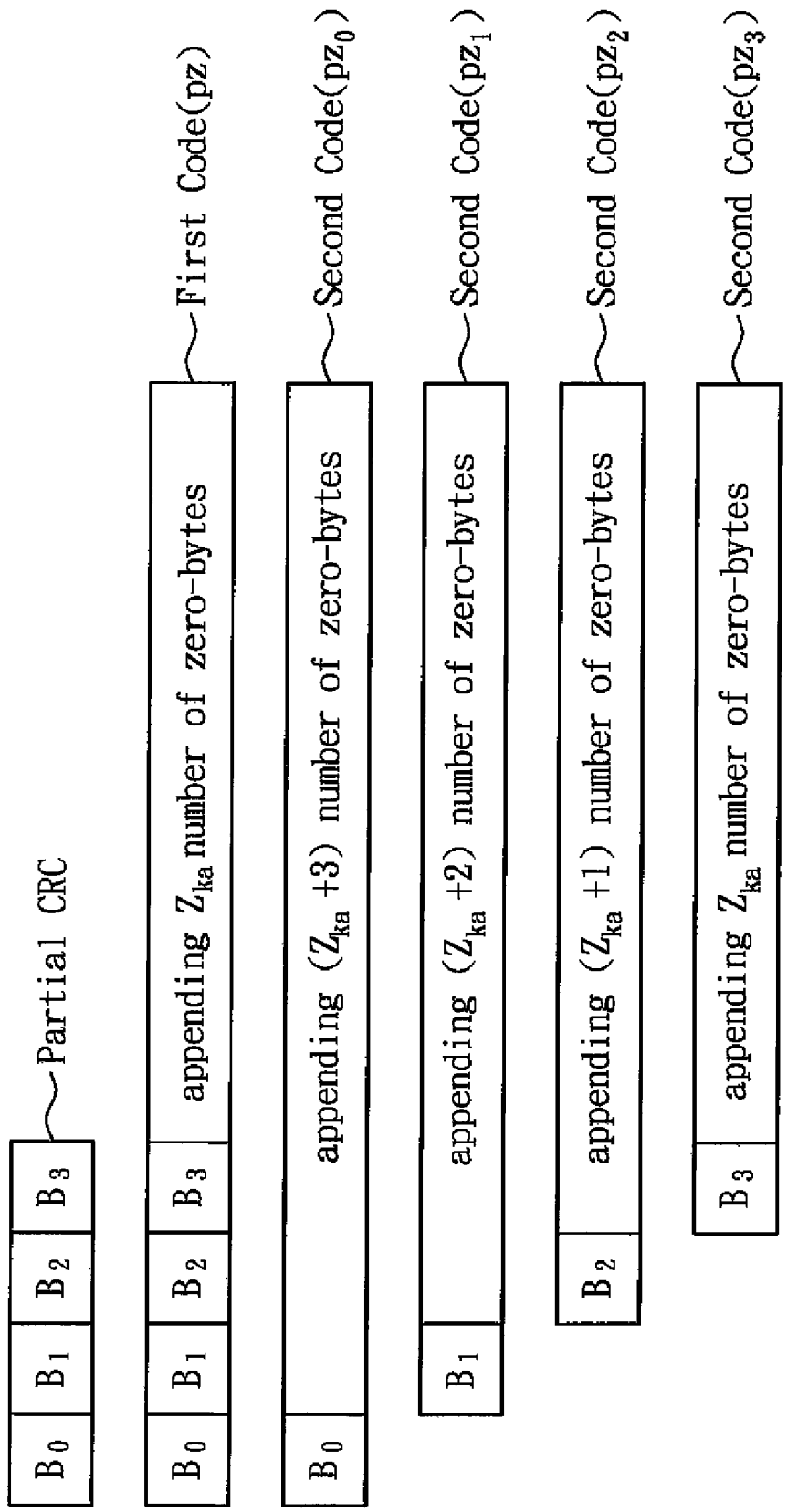
FIG. 8 is the schematic view of partial CRC, First Code and a plurality of Second Codes of the invention.

Assume a message m is sliced into n segments and each segment is labeled as segment$_i$. wherein i is integer and i=0 to n−1. According to the above discussion, during receiving each segment, a partial-CRC can be pre-computed in the Computation Phase. For example, as segment$_k$ is received, a partial-CRC$_k$ can be pre-computed, wherein k is integer and $0 \leq k < n$. Referring to FIG. 8, it shows a partial-CRC$_k$ calculated according to segment$_k$ by the Computation Phase. Since the embodiment is based on 32-bit CRC, the partial CRC is 32-bit/4-byte wide. From the most significant byte to least significant byte, the 4-byte partial-CRC$_k$ can be regarded as 4 bytes, for high byte to low byte, they are a first sub-byte $B_0$, a second sub-byte $B1$, a third sub-byte $B2$ and a fourth sub-byte $B3$. By appending $z_{ka}$ zeroed-byte to the partial-CRC$_k$, a First Code pz is generated, wherein the $z_{ka}$ is computed as same as equation (8) except should be further divided by 8 to fit the unit of zero-byte instead of zero-bit.

The First Code (pz) can be treated as the sum of four Second Codes, wherein the four Second Codes are $pz_0$ ' $pz_1$ ' $pz_2$ and $pz_3$, as shown in FIG. 8. Because CRC has linear transformation characteristic, the First Code and the four Second Codes have a relationship as stated in equation (9).

$$CRC(pz) = CRC(pz_0 \oplus pz_1 \oplus pz_2 \oplus pz_3) \quad (9)$$
$$= CRC(pz_0) \oplus CRC(pz_1) \oplus CRC(pz_2) \oplus CRC(pz_3)$$

As shown in equation (9), the CRC of the four Second Codes can be calculated respectively, then the result of the CRC calculation of the four Second Codes can be merged by the bitwise-XOR operation to get the same result of the CRC calculation of the First Code pz. Since the CRC calculation of the four Second Codes is somewhat simpler than the CRC calculation of the First Codes, we propose that it is better to generate the Adjusted-CRC from the Second Codes instead of the First Code. Hence in the following paragraphs, methods of generating the Adjusted-CRC from the Second Codes are provided.

Figure 9:
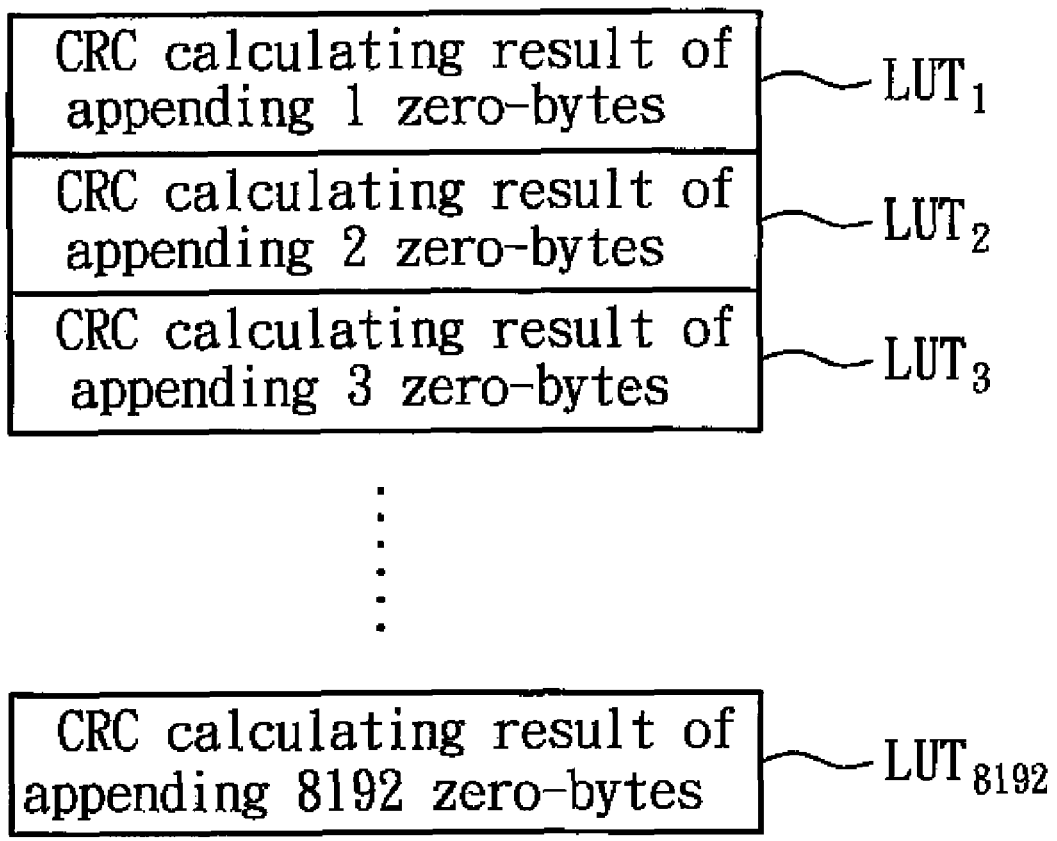
FIG. 9 is the schematic view of Memory arrangement according to a first embodiment of the invention.

Since each of the Second Codes, i.e. $pz_0$, $pz_1$, $pz_2$ and $pz_3$, has only its most significant byte with value of $B_0$, $B_1$, $B_2$ or $B_3$, while other bytes are all set to zero. a Memory can be used as the look-up table to store the pre-computed CRC result of Second Codes. The Memory comprises a plurality of blocks, each block stores a plurality of pre-computed CRC results corresponding to a bytes, as shown in FIG. 9. In the embodiment, the Memory of FIG. 9 comprises 8192 blocks, they are $LUT_1 \sim LUT_{8192}$ respectively. Each block records 256 pre-computed CRC results mapping to the 256 possible combinations of a byte. More specifically, the block $LUT_i$ stores the pre-computed CRC results of the Second Code with i appended zero-byte(s), for example, $LUT_1$ stores the pre-computed CRC results of the Second Code with one appended zero-byte, block $LUT_2$ stores the pre-computed CRC results of the Second Code with two appended zero-bytes and block $LUT_{8192}$ stores the pre-computed CRC results of the Second Code with 8192 appended zero-bytes. Hence $LUT_1 \sim LUT_{8192}$ can be defined as equation (10).

$$LUT_1(B(x)) = (B(x) \times x^{1 \times 8}) \bmod g(x)$$

$$LUT_2(B(x)) = (B(x) \times x^{2 \times 8}) \bmod g(x)$$

...

$$LUT_{8192}(B(x)) = (B(x) \times x^{8192 \times 8}) \bmod g(x) \quad (10)$$

It equals to equation (11).

$$LUT_p(B(x)) = (B(x) \times x^{8p}) \bmod g(x) \quad (11)$$

wherein B(x) in equation (10) and equation (11) is the polynomial representation of a 8-bit data such as $B_0$, $B_1$, $B_2$ and $B_3$.

Based on the $LUT_1 \sim LUT_{8192}$, the result of the CRC calculation can be quickly found. For example, since the Second Code $pz_0$ has $z_{ka}+3$ zeroed-bytes, from the Memory in FIG. 9, the 32-bit pre-computed CRC result stored in position $B_0$ of block $LUT_{z_{ka}+3}$ can be found as the solution of $CRC(pz_0)$. Since the Second Code $pz_1$ has $z_{ka}+2$ zero-bytes, from the Memory in FIG. 9, the 32-bit pre-computed CRC result stored in position $B_1$ of block $LUT_{z_{ka}+2}$ can be found as the solution of $CRC(pz_1)$. Since the Second Code $pz_2$ has $z_{ka}+1$ zero-bytes, from the Memory in FIG. 9, the 32-bit pre-computed CRC result stored in position $B_2$ of block $LUT_{z_{ka}+1}$ can be found as the solution of $CRC(pz_2)$. Since the Second Code $pz_3$ has $z_{ka}$ zero-bytes, from Memory in FIG. 9, the 32-bit pre-computed CRC result stored in position $B_3$ of block $LUT_{z_{ka}}$ can be found as the solution of $CRC(pz_3)$. After the results of $CRC(pz_0)$ ' $CRC(pz_1)$ ' $CRC(pz_2)$ and $CRC(pz_3)$ are found in blocks $LUT_{z_{ka}+3}$, $LUT_{z_{ka}+2}$, $LUT_{z_{ka}+1}$ and $LUT_{z_{ka}}$ from the Memory, the Adjusted CRC of sub-message corresponding to segmentk can be obtain by merging the results by bit-wise XOR operation as stated in equation (12).

$$CRC(pz) = CRC(pz_0) \oplus CRC(pz_1) \oplus CRC(pz_2) \oplus CRC(pz_3) \quad (12)$$
$$= LUT_{z_{kn}+3}(B_0) \oplus LUT_{z_{kn}+2}(B_1) \oplus$$
$$LUT_{z_{kn}+1}(B_2) \oplus LUT_{z_{kn}}(B_3)$$

In this first embodiment, one 16 MB Memory look-up table can be prepared for iSCSI message of 16 KB as shown in FIG. 9 so as to speed up the calculation of the Adjusting Phase to obtain the Adjusted CRC.

Figure 10:
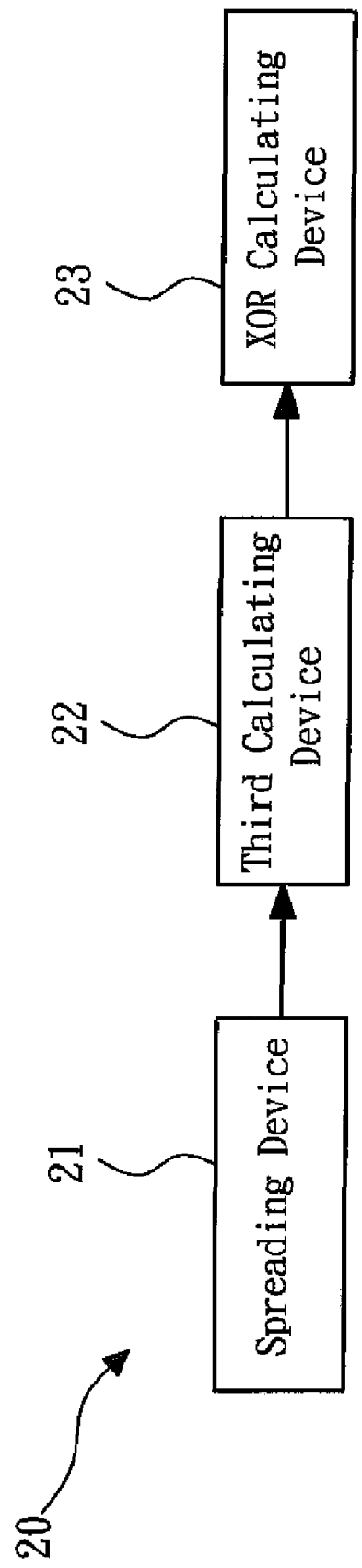
FIG. 10 is the schematic view of the Second Calculating Device according to the first embodiment of the invention.

Referring to FIG. 10, it shows the schematic view of the Second Calculating Device of the first embodiment in the invention. The Second Calculating Device of the first embodiment in the invention 20 comprises: a Spreading Device 21, a Third Calculating Device 22 and an XOR Calculating Device 23.

The Spreading Device 21 is used for spreading the First Code into a plurality of Second Codes as shown in FIG. 8. The Partial CRC comprises a plurality of sub-bytes, the sub-bytes are spread to the most significant bytes of the Second Codes respectively, and the other bytes of the Second Code are zero. The Third Calculating Device 22 is used for executing CRC calculation of each Second Codes so as to get a plurality of the Third Codes respectively. The XOR Calculating Device 23 is used for merging all the Third Codes into an Adjusted CRC by bit-wise XOR operation.

Figure 11:
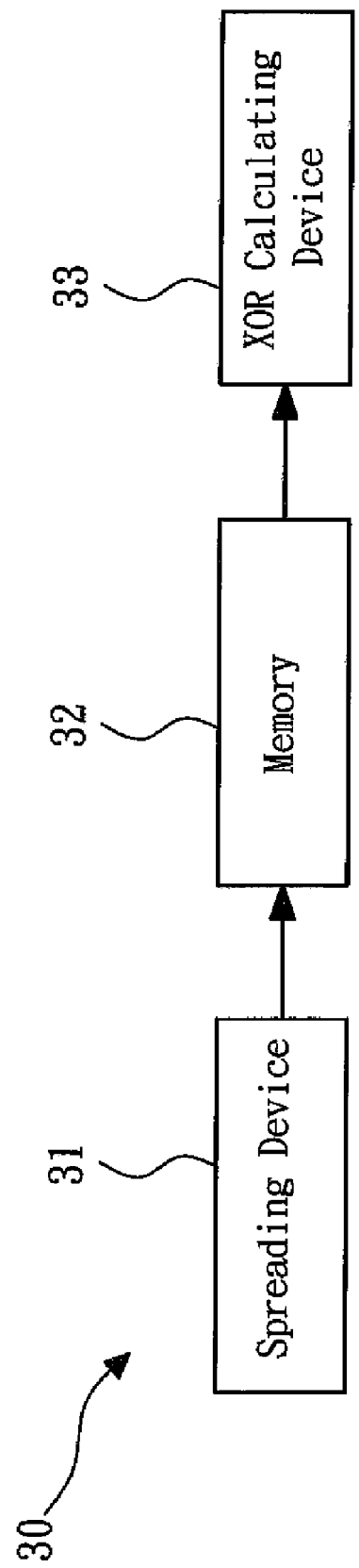
FIG. 11 is the schematic view of another implementation of the Second Calculating Device according to the first embodiment of the invention.

Referring to FIG. 11, it shows the schematic view of another implementation of the Second Calculating Device according to the first embodiment of the invention. The Second Calculating Device 30 comprises: a Spreading Device 31, a Memory 32 and an XOR Calculating Device 33. The Spreading Device 31 is used for spreading the First Code into a plurality of Second Codes as shown in FIG. 8 The Partial CRC comprises a plurality of sub-bytes, the sub-bytes are spread to the most significant bytes of the Second Codes respectively, and the other bytes of the Second Code are zero.

Figure 13A:
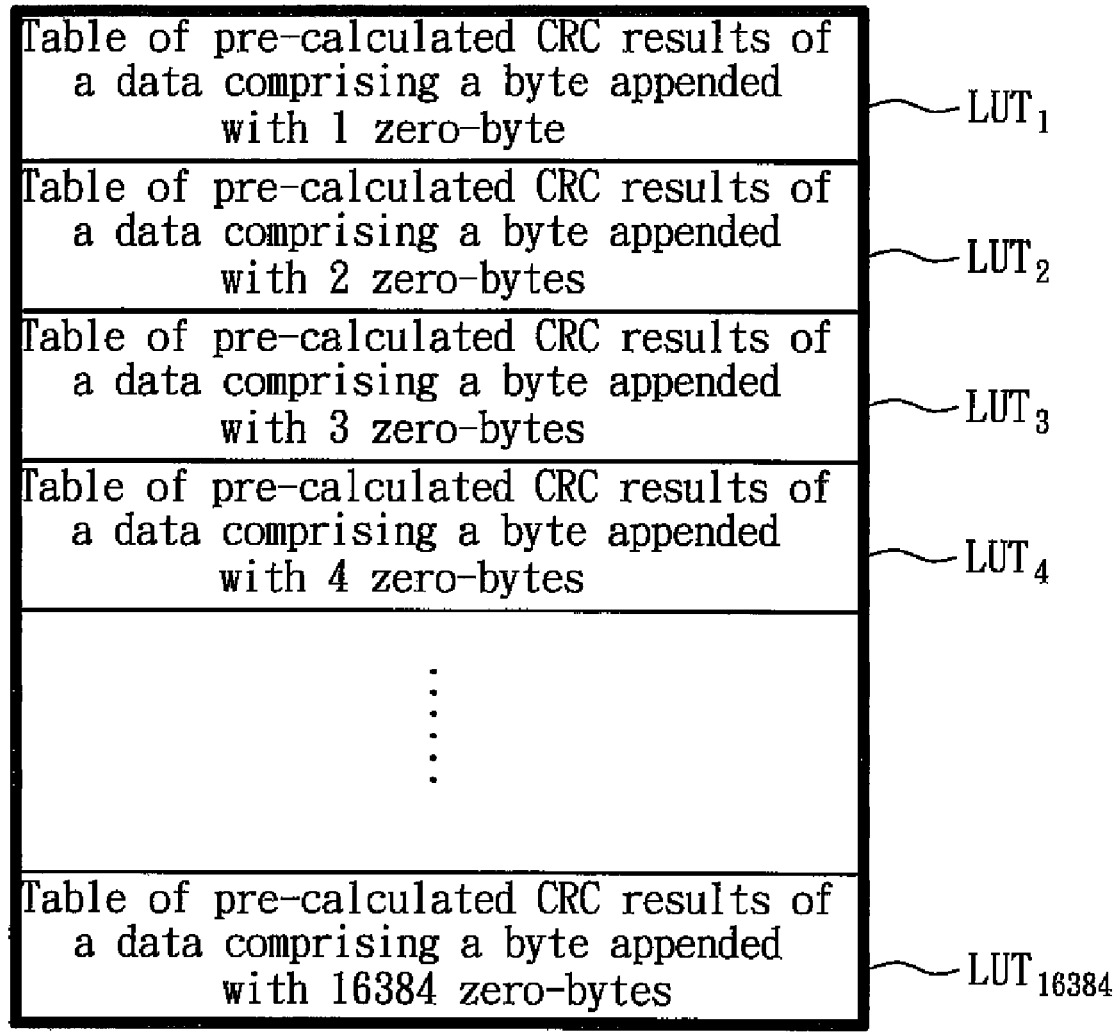
FIG. 13A is the schematic view of Memory arrangement according to the first embodiment of the invention.

Pre-calculated CRC results of a data comprising a byte appended with numbers of zero-byte(s) are stored in the Memory 32. The content of Memory 32 can be referred in FIG. 13A. Since the Third Codes are the CRC calculating results of the Second Codes, a plurality of Third Codes can be obtained from the Memory 32 correspondingly according to the Second Codes. The XOR Calculating Device 33 is used for merging the Third Codes by XOR operation to obtain the Adjusted CRC.

The above method of the first embodiment can just use 4 CPU local bus transactions to complete Adjusting Phase if no cache is used. However it needs bigger Memory space as the look-up table.

The Second Embodiment

As mentioned, though the first embodiment can quickly conduct Adjusting Phase, it needs bigger Memory space as the look-up table. However, common embedded systems have limited Memory resource; it cannot provide so large Memory space as required in the first embodiment. In the second embodiment, by re-using a subset of pre-computed CRC results of the first embodiment, a relatively smaller Memory space is required, thus it can be used for most application.

Figure 12:
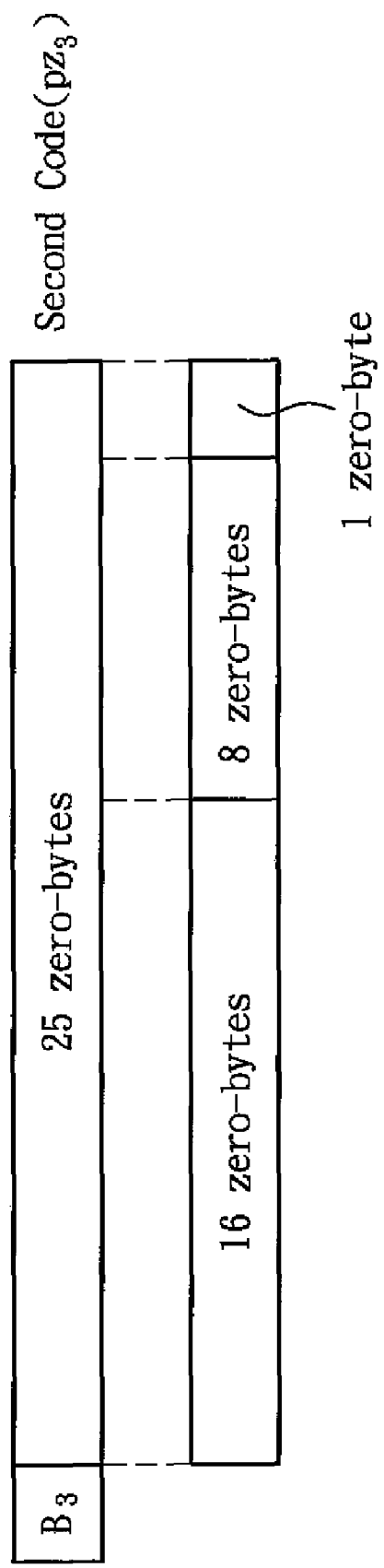
FIG. 12 is the decomposed schematic view of the First Order Value according to the Second Code of the invention.

To describe the method of the second embodiment, a new term called First Order Value is defined as the number of appended zero-bytes in Second Code. For example, referring to FIG. 8 and FIG. 12, since the Second Code $pz_3$ has $z_{ka}$ appended zero-bytes, the First Order Value of Second Code $pz_3$ is $z_{ka}$. The First Order Value can then be decomposed into a plurality of Second Order Values according to its combination of power of two. For example, in FIG. 12, the Second Code $pz_3$ has 25 zero-bytes appended after its most significant byte $B_3$, so the First Order Value of the Second Code $pz_3$ is 25. Since First Order Value 25 is the sum of 16 (i.e. $2^4$), 8 (i.e. $2^3$) and 1 (i.e. $2^0$) in terms of power of two, we can treat the pz3 as byte B3 appended with 16 zero-bytes plus 8 zero-bytes plus 1 zero-bytes and declare that 25 has 3 Second Order Values of 16, 8 and 1.

In principle, based on the above decomposition, if it needs to obtain CRC calculating result of the Second Code $pz_3$, it can firstly obtain a first CRC calculating result of the $B_3$ byte appended with 16 zero-bytes by looking a look-up table, which is generated as same as the first embodiment; then obtain a second CRC calculating result of the first CRC calculating result appended with 8 zero-bytes by the said look-up table; finally, obtain a third CRC calculating result of the second CRC calculating result appended with 1 zero-byte by the said look-up table, wherein the third CRC calculating result is CRC calculating result of the Second Code $pz_3$.

Figure 13B:
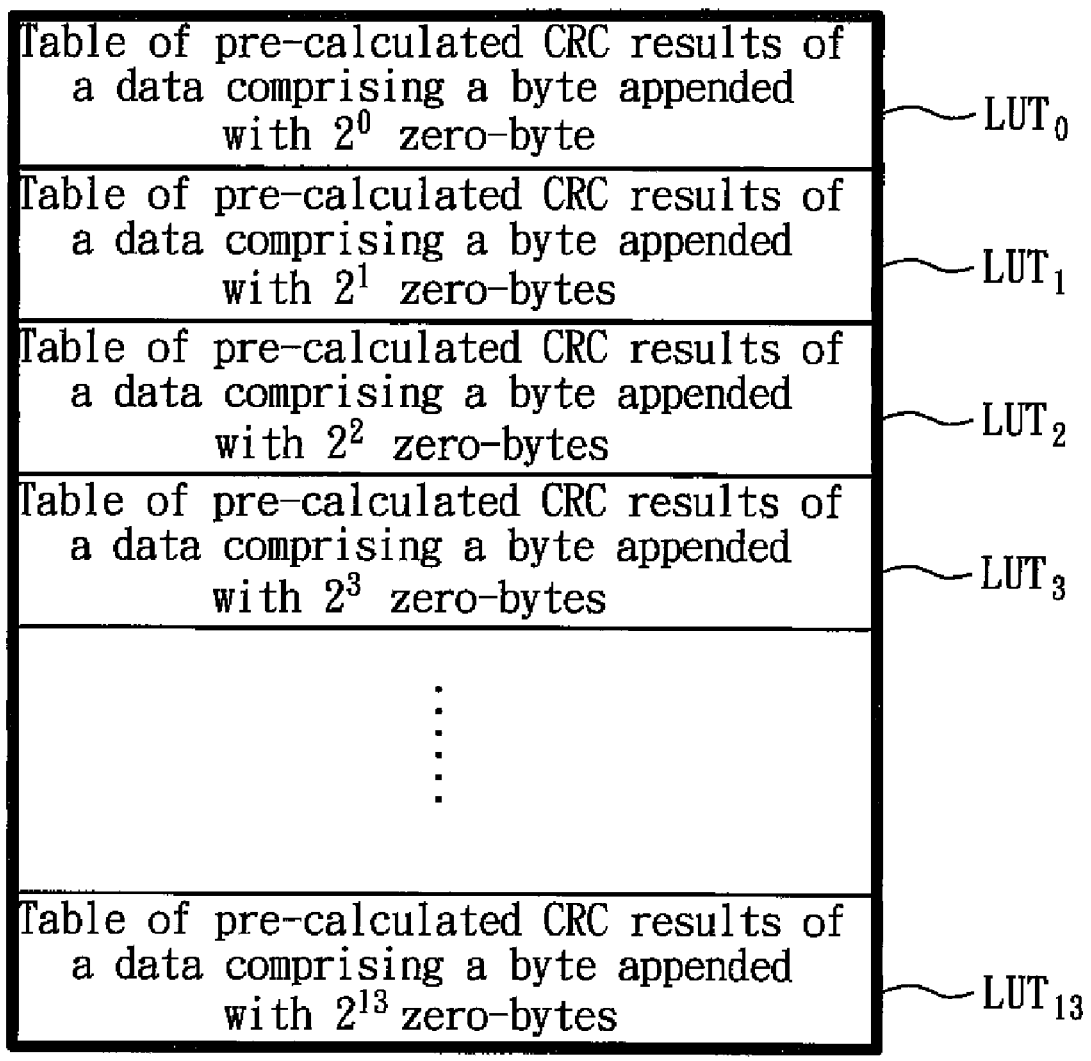
FIG. 13B is the schematic view of Memory arrangement according to the second embodiment of the invention.

Based on the above principle, the second embodiment method can reduce the required Memory size since it only retains the blocks belonging to the powers of two compared with the above first embodiment. For example, to process the CRC calculation of 16 KB iSCSI packets, only 14 KB Memory, comprising 14 look-up table blocks, is required as shown in FIG. 13B.

There is another issue for most CRC applications as applying the above principle. For example, if 32-bit CRC is applied, 4-byte CRC calculating result can be obtained according to the first byte of a Second Code, e.g. the $B_3$ of $pz_3$) in the first step of table looking-up. Hence in the next iteration of table looking-up, the 4-byte CRC calculating result should be firstly decomposed into 4 bytes so as to conduct 4 times of the table looking-up and then get four 4-byte CRC calculating results. In the same way, if no merging operation takes place before conducting each step of table looking-up, the number of intermediate CRC calculating results may be divergent. To avoid such a divergence, in the exemplary implementation of the second embodiment, the four 4-byte CRC calculating results are merged into one 4-byte CRC calculating result prior to the table looking-up in the next iteration.

Figure 14:
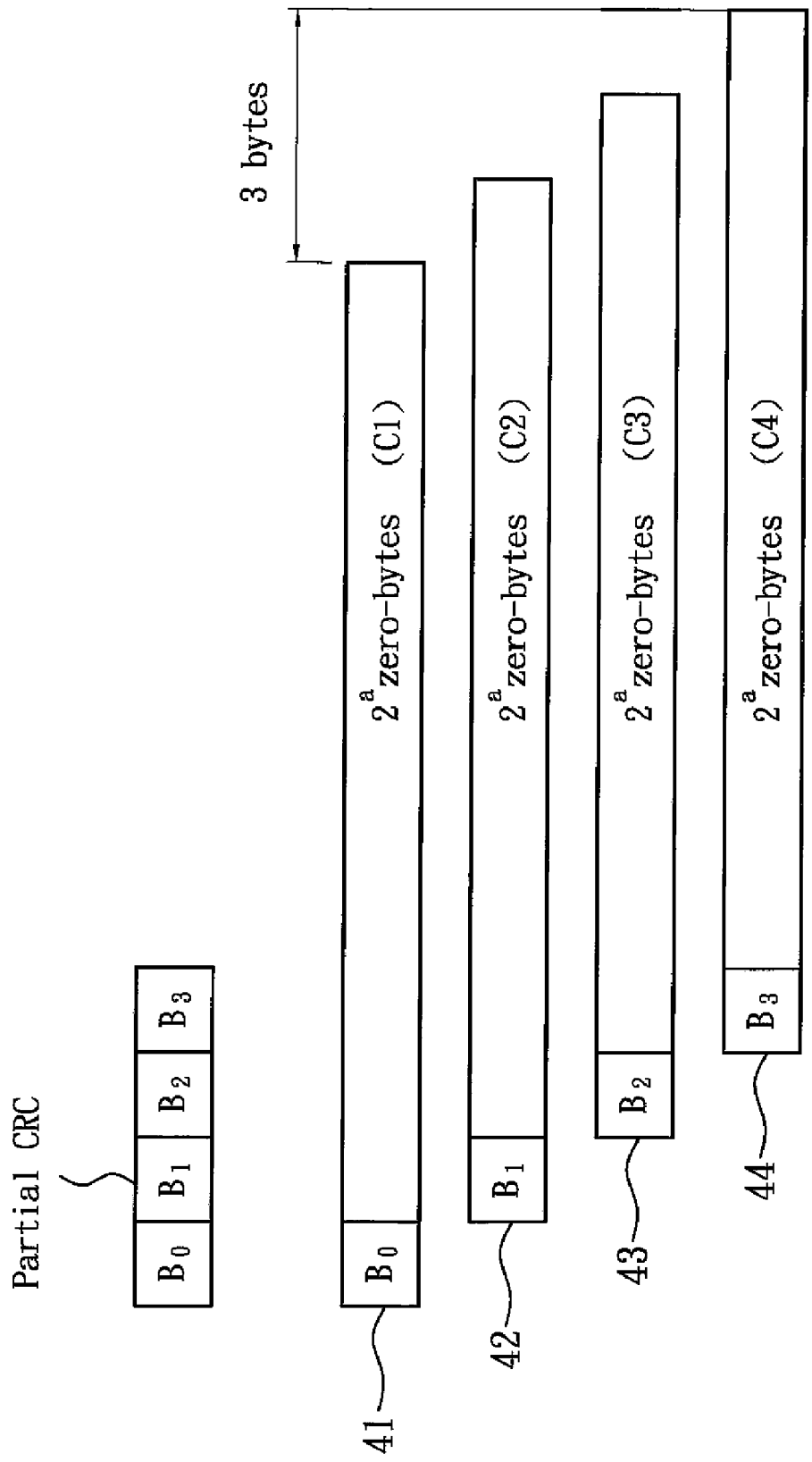
FIG. 14 is the schematic view of a plurality of Second Codes according to the second embodiment of the invention.

Referring to FIG. 14, it shows the schematic view of a plurality of segments of Second Codes which is to be processed in each iteration of the second embodiment of the invention. Each of the segments comprises a sequence of zero-byte in number of power of two. For example, in case of the First Order Value equaling 25, from big to small, the Second Order Values of 16 (i.e. $2^4$), 8 (i.e. $2^3$) and 1 (i.e. $2^0$) can be obtained. For exemplary purpose, in Iteration 1, the biggest Second Order Value of $16(2^4)$ is used, thus each segments of the Second Codes comprises one byte exclusively extracted from the partial CRC ($B_0B_1B_2B_3$) appended with 2a zero-bytes, wherein a=4, as shown in FIG. 14. The Partial CRC ($B_0B_1B_2B_3$) has four sub-bytes, the sub-bytes are spread to the most significant bytes of the Second Codes respectively, the other bytes of the Second Codes are zero. A byte number of the zero-bytes is the Second Order Processing value. In the embodiment, four Second Codes comprises the Second Code 41 with a first sub-byte ($B_0$), the Second Code 42 with a second sub-bytes ($B_1$), the Second Code 43 with a third sub-byte ($B_2$) and the Second Code 44 with a fourth sub-byte ($B_3$).

In FIG. 14, the C1~C4 stand for clock cycle 1 to clock cycle 4. Since 4 clock cycles are needed in each iteration to process the 4 segments of Second Codes in case of using 32-bit CRC, we may process the segment with $B_0$ first and then $B_1$, $B_2$ and $B_4$. For example, during the first clock (C1), a Third Code can be obtain by looking for the CRC calculating result of segment 41 with the byte $B_0$ appended with appended with $2^a$ zero-bytes, wherein a=4, from at least one Memory (referring to FIG. 13B). The Third Code can be combined with the Third Codes of other three segments during proceeding through C2, C3, C4 so as to get a intermediate calculating result for next iteration.

Figure 15:
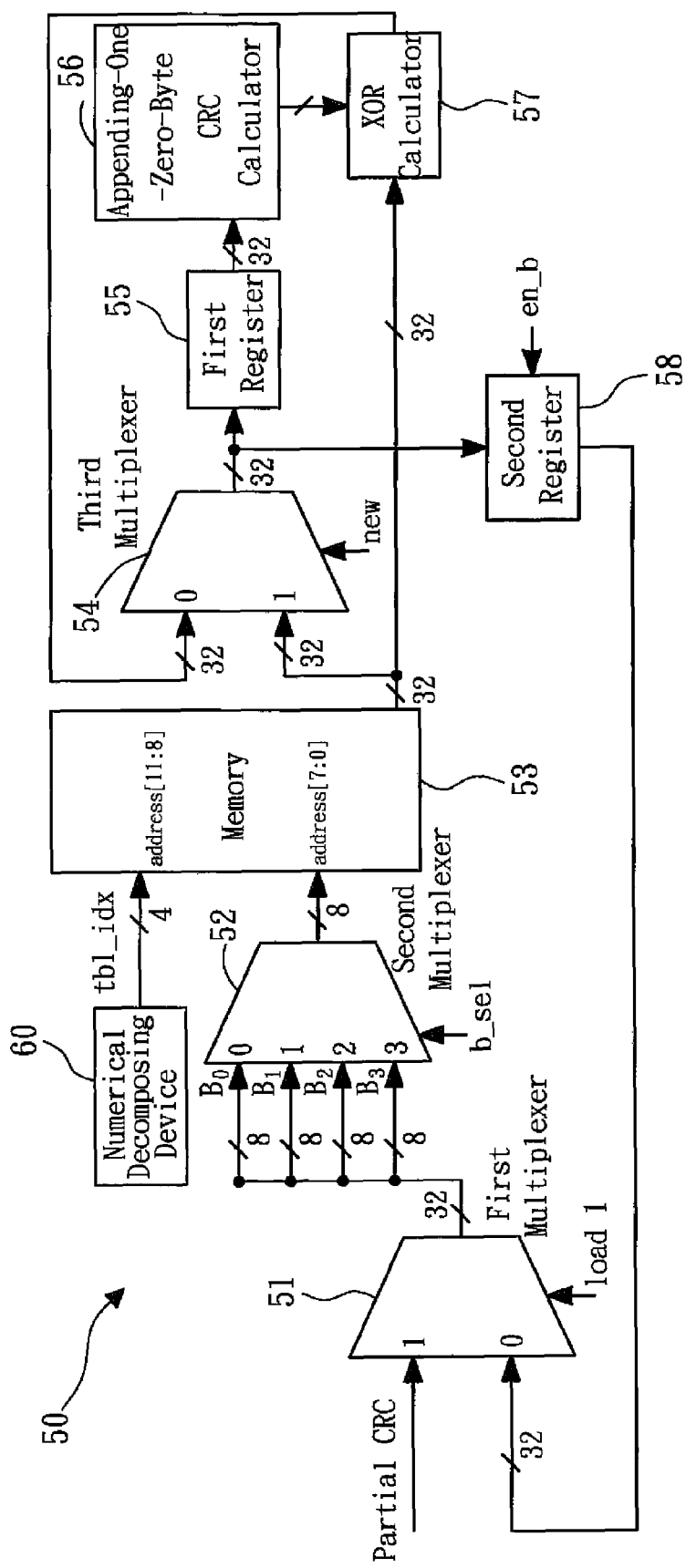
FIG. 15 is the schematic view of the Second Calculating Device according to the second embodiment of the invention.

Referring to FIG. 15, the second embodiment is implemented by an exemplary hardware circuit. According to the second embodiment of the invention, the Second Calculating Device 50 comprises: a Numeric Decomposing Device 60, a First Multiplexer 51, a Second Multiplexer 52, at least one Memory 53, a Third Multiplexer 54, a First Register 55, a Appending-One-Zero-Byte CRC Calculator 56, a XOR Calculator 57 and a Second Register 58.

The Numerical Decomposing Device 60 is used for decomposing a First Order Value into a sequence of Second Order Value (s) according to combination of powers of two as discussed. For example, a First Order Value of 25 can be decomposed into Second Order Values of 16, 8 and 1.

The First Multiplexer 51 is used for switching its output to either the Partial CRC or the intermediate calculating result from previous iteration according the firstselecting signal load1. The Partial CRC and the iteration calculating result both have a plurality of sub-bytes. In the embodiment, the Partial CRC and the iteration calculation result both have four sub-bytes. The Second Multiplexer 52 is used for switching the four bytes given from the output of First Multiplexer 51 according to the second selecting signal b_sel.

The Memory 53 storing blocks of look-up tables, i.e. $LUT_x$ where $x=2^a$ and $a=0-13$ for processing 16 KB iSCSI message is used for latter table looking-up. The exemplary content of Memory 53 can be referred in FIG. 13B. The Memory 53 is used for storing a plurality of Third Codes, and the Third Codes are CRC calculating results of the Second Codes. The most significant bytes of the Second Codes are the sub-bytes respectively, and the other bytes of the Second Codes are set to zero. A byte number of the zero-bytes is the Second Order Value.

The Third Multiplexer 54 is used for switching the result of table looking-up and the result of the XOR Calculator 57 according to a third selecting signal (new). The Third Multiplexer 54 is used for receiving the Third Code and a XOR calculating result, and for switching the Third Code or XOR calculating result to an output of the Third Multiplexer 54 as a first intermediate CRC calculating result according to a third selecting signal (new).

The First Register 55 is used for storing the output of the Third Multiplexer and the output, after being processed by Appending-One-Zero-Byte CRC Calculator 56, can be merged with the result of table looking-up By XOR Calculator 57. The First Register 55 is used for storing the first intermediate CRC calculating result. The Appending-One-Zero-Byte CRC Calculator 56 is used for appending one zero-byte after the first intermediate CRC calculating result, and for CRC calculating to obtain a second intermediate CRC calculating result.

The XOR Calculator 57 is used for XOR calculating the Third Codes and the second intermediate CRC calculating result to obtain the XOR calculating result and output to the Third Multiplexer 54. The Second Register 58 is used to fetch the intermediate CRC calculating result of each iteration according to the enabling signal en_b. That is, as en_b asserted as hish, the Second Register fetches the output of Third Multiplexer 54 as the intermediate CRC calculating result of each iteration.

The calculation method of the second embodiment is described in detail as follows by an example with First Order Value of 25.

In the first iteration (Iteration 1), during the first clock cycle C1, by the calculation of the Numeric Decomposing Device 60, a Second Order Value of 16 (i.e. $2^4$) is extracted from the First Order Value of 25. Then according to the Second Order Value of 16 (i.e. $2^4$), the signal tbl_idx is set to 4 to index to the $LUT^x$ where $x=2^a$ and $a=4$. The selecting signal load1 to the First Multiplexer 51 is set to 1 so as to let the Partial CRC be switched to the output of the First Multiplexer 51. Then the selecting signal b_sel to the Second Multiplexer 52 is set to let $B_0$ of Partial CRC be switched to the input of Memory 53.

Figure 16A:
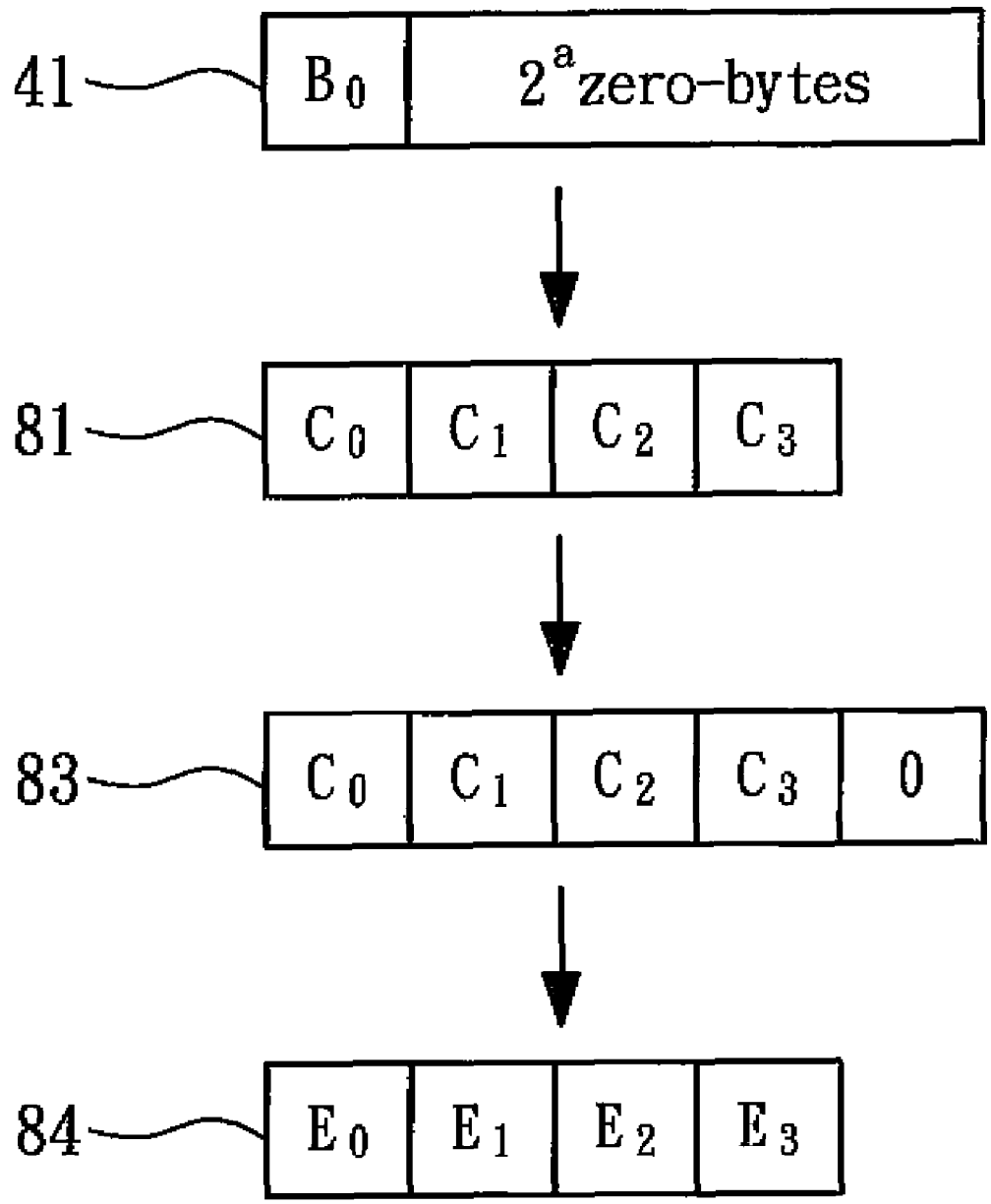
FIGS. 16A to 16G are the schematic view showing computation according to the second embodiment of the invention.

Now the CRC calculating result of the byte $B_0$ appended with $2^4$ zero-bytes can be obtained by getting the Memory content at address {tbl_idx, $B_0$} in Memory 53. Referring to FIG. 16A, the data comprising byte $B_0$ appended with $2^a$ zero-bytes, wherein $a=4$, is regarded as Data 41. Based on the address {tbl_idx, $B_0$} got from Data 41, Third Code 81 can be found in Memory 53. By setting the selecting signal new to 1, the Third Code 81 is then be switched to the output of Third Multiplexer 54. As next clock edge arrives, the Third Code 81 is registered by First Register 55 so as to complete the actions during the first clock cycle C1.

Figure 16B:
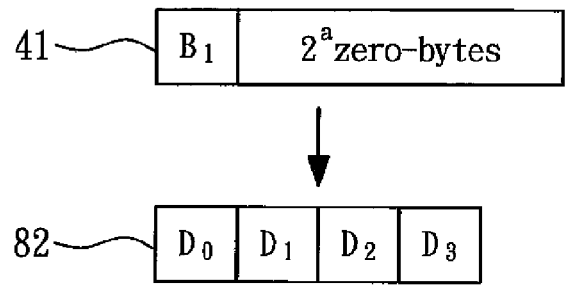

The data comprising byte $B_1$ appended with 24 zero-bytes byte is regarded as Data 42. During the second clock cycle C2, the CRC calculating result of Data 42 can be obtained by getting the Memory content at address {tbl_idx, $B_0$} in Memory 53. As shown in FIG. 16B, the CRC calculating result of Data 42 is regarded as Fourth Code 82.

Figure 16C:
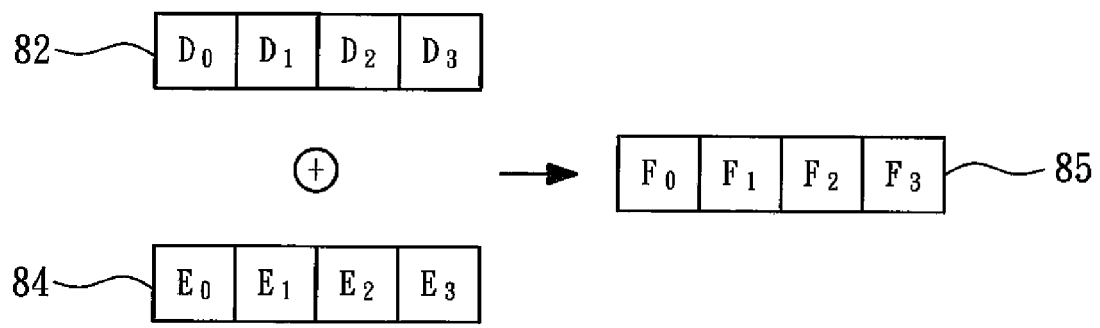

Referring to FIG. 16A, Fifth Code 83 can be obtained from Third Code 81 by appending one zero-byte to the Third Code 81. Then the CRC calculating result of the Fifth Code 83 is regarded as Sixth Code 84. The derivation of Sixth Code 84 from Third Code 81 is conducted by the Appending-One-Zero-Byte CRC Calculator 56. Referring to FIG. 16C, merging the Fourth Code 82 and the Sixth Code 84 by XOR Calculator 57 results in the Seventh Code 85.

Referring to FIG. 14 and FIG. 16A, since the Third Code 81 is the CRC calculating result of the byte $B_0$ appended with $2^4$ zero-bytes instead of ($2^{4+1}$) zero-bytes, it should be processed by the Appending-One-Zero-Byte CRC Calculator 56 before merging with the CRC calculating result of the byte $B_1$ appended with $2^4$ zero-bytes, i.e. the Fourth Code 82.

Now the FIG. 15, FIG. 16A and FIG. 16C are referred for the descriptions of the calculation during the second clock cycle C2. During the second clock cycle C2, the selecting signal b_sel to the Second Multiplexer 52 is set to 1 to let $B_1$ of the Partial CRC be switched to the input of Memory 53. Then the CRC calculating result of the byte $B_1$ appended with 24 zero-bytes can be obtained by getting the Memory content at address {tbl_idx, $B_1$} in Memory 53. Referring to FIG. 16B, the data comprising byte $B_1$ appended with $2^a$ zero-bytes, wherein $a=4$, is regarded as Data 42. Based on the {tbl_idx, $B_1$} being fed to address input of Memory 53, Fourth Code 82 can be got in the output of Memory 53. Since the output of Memory 53 is wired to an input of XOR calculator 57, the Fourth Code 82 will be merged with Sixth Code 84 generated from the output of Appending-One-Zero-Byte CRC Calculator 56, resulting the Seventh Code 85 at the output of XOR calculator 57 XOR Calculator 57. Meanwhile, By setting the selecting signal new to 0, the Seventh Code 85 is then be switched to the output of Third Multiplexer 54. As next clock edge arrives, the Seventh Code 85 is registered by First Register 55 so as to complete the actions during the second clock cycle C2.

Figure 16D:
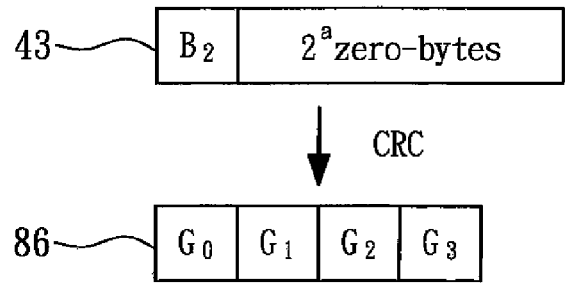

The data comprising byte $B_2$ appended with $2^4$ zero-bytes byte is regarded as Data 43. During the third clock cycle C3, the CRC calculating result of Data 43 can be obtained by getting the Memory content at address {tbl_idx, $B_2$} in Memory 53. As shown in FIG. 16D, the CRC calculating result of Data 43 is regarded as Eighth Code 86.

Figure 16E:
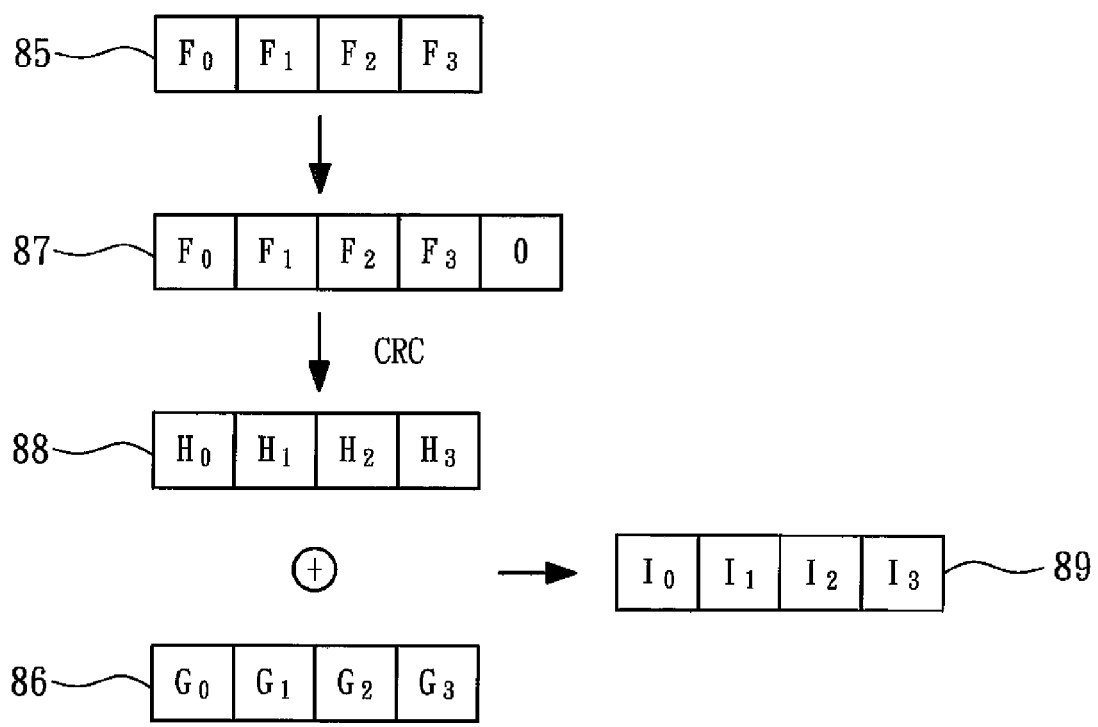

Referring to FIG. 16E, Ninth Code 87 can be obtained from Seventh Code 85 by appending one zero-byte to the Seventh Code 85. Then the CRC calculating result of the Ninth Code 87 is regarded as Tenth Code 88. The derivation of Tenth Code 88 from Seventh Code 85 is conducted by the Appending-One-Zero-Byte CRC Calculator 56. Referring to FIG. 16E, merging the Tenth Code 88 and the Eighth Code 86 by XOR Calculator 57 results in the Eleventh Code 89.

Referring to FIG. 14 and FIG. 16E, with the same reason of Third Code 81, the Seventh Code 85 should be processed by the Appending-One-Zero-Byte CRC Calculator 56 before merging with the CRC calculating result of the byte $B_2$ appended with 24 zero-bytes, i.e. the Eighth Code 86.

Now the FIG. 15, FIG. 16D and FIG. 16E are referred for the descriptions of the calculation during the third clock cycle C3. During the third clock cycle C3, the selecting signal b_sel to the Second Multiplexer 52 is set to 1 to let $B_2$ of the Partial CRC be switched to the input of Memory 53. Then the CRC calculating result of the byte $B_2$ appended with $2^4$ zero-bytes can be obtained by getting the Memory content at address {tbl_idx, $B_2$} in Memory 53. Referring to FIG. 16D, the data comprising byte $B_2$ appended with $2^a$ zero-bytes, wherein $a=4$, is regarded as Data 43. Based on the {tbl_idx, $B_2$} being fed to address input of Memory 53, Eighth Code 86 can be got in the output of Memory 53. Since the output of Memory 53 is wired to an input of XOR calculator 57, the Eighth Code 86 will be merged with Tenth Code 88 generated from the output of Appending-One-Zero-Byte CRC Calculator 56, resulting the Eleventh Code 89 at the output of XOR calculator 57 XOR Calculator 57. Meanwhile, By setting the selecting signal new to 0, the Eleventh Code 89 is then be switched to the output of Third Multiplexer 54. As next clock edge arrives, the Eleventh Code 89 is registered by First Register 55 so as to complete the actions during the third clock cycle C3.

Figure 16F:
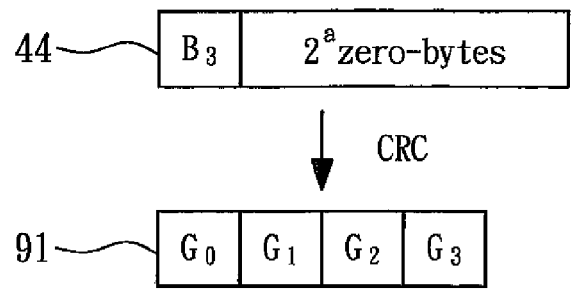

The data comprising byte $B_3$ appended with $2^4$ zero-bytes byte is regarded as Data 44. During the fourth clock cycle C4, the CRC calculating result of Data 44 can be obtained by getting the Memory content at address {tbl_idx, $B_3$} in Memory 53. As shown in FIG. 16F, the CRC calculating result of Data 44 is regarded as Twelfth Code 91.

Figure 16G:
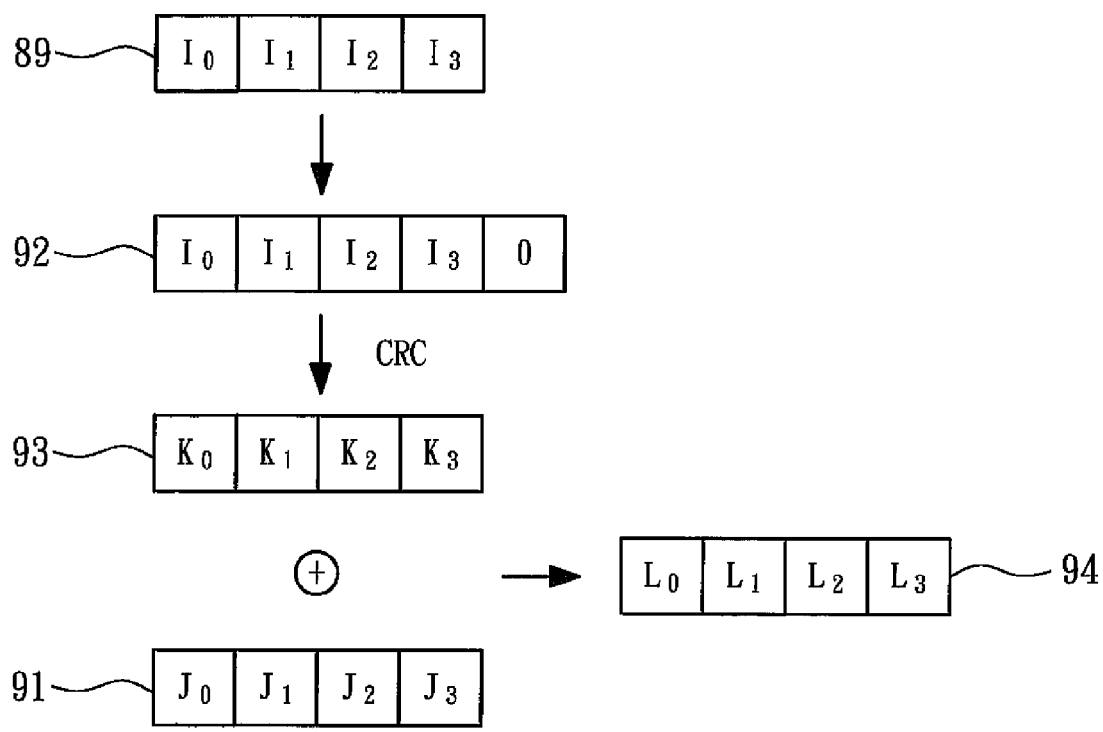

Referring to FIG. 16G, Thirteenth Code 92 can be obtained from Eleventh Code 89 by appending one zero-byte to the Eleventh Code 89. Then the CRC calculating result of the Thirteenth Code 92 is regarded as Fourteenth Code 93. The derivation of Fourteenth Code 93 from Eleventh Code 89 is conducted by the Appending-One-Zero-Byte CRC Calculator 56. Referring to FIG. 16G, merging the Fourteenth Code 93 and the Twelfth Code 91 by XOR Calculator 57 results in the Fifteenth Code 94.

Note that, after proceed through clock cycle C1, C2, C3 and C4, the Fifteenth Code 94 is the intermediate CRC calculating result of the Iteration 1. More specifically, it is the CRC calculating result of Partial CRC appended with $2^a$ zero-bytes, wherein a=4 according to a Second Order Value of 16 in the exemplary case.

Now the FIG. 15, FIG. 16F and FIG. 16G are referred for the descriptions of the calculation during the forth clock cycle C4. During the forth clock cycle C4, the selecting signal b_sel to the Second Multiplexer 52 is set to 1 to let $B_3$ of the Partial CRC be switched to the input of Memory 53. Then the CRC calculating result of the byte $B_3$ appended with 24 zero-bytes can be obtained by getting the Memory content at address {tbl_idx, $B_3$} in Memory 53. Referring to FIG. 16F, the data comprising byte $B_3$ appended with $2^a$ zero-bytes, wherein a=4, is regarded as Data 44. Based on the {tbl_idx, $B_3$} being fed to address input of Memory 53, Twelfth Code 91 can be got in the output of Memory 53. Since the output of Memory 53 is wired to an input of XOR calculator 57, the Twelfth Code 91 will be merged with Fourteenth Code 93 generated from the output of Appending-One-Zero-Byte CRC Calculator 56, resulting the Fifteenth Code 94 at the output of XOR calculator 57 XOR Calculator 57. Meanwhile, By setting the selecting signal new to 0, the Eleventh Code 89 is then be switched to the output of Third Multiplexer 54. As next clock edge arrives, the Fifteenth Code 94 is registered by Second Register 58 for next iteration so as to complete the actions during the fourth clock cycle C4.

In the exemplary case, the First Order Value of 25 is decomposed into three Second Order Values of 16, 8, 1, hence three iterations are needed. After the Fifteenth Code 94 is calculated as the CRC calculating result of Partial CRC appended with $2^a$ zero-bytes, wherein a=4 according to a Second Order Value of 16, the Fifteenth Code 94 is used in place of the Partial CRC by setting load1=0 to proceed the second iteration. In the second iteration, 8 (23) can be extracted from the First Order Value of 25 as the next Second Order Value, hence the symbol "a" in the FIG. 14 stands for 3 in the second iteration. By repeating the procedures conducted during clock cycle C1, C2, C3 and C4, the Fifteenth Code 94 for the Iteration 2 can be obtained. More specifically, it is the CRC calculating result of Partial CRC appended with $(2^a+2^b)$ zero-bytes, wherein a=4 and b=3, according to the Second Order Values of 16 and 8 in the exemplary case.

After the Fifteenth Code 94 is calculated as the CRC calculating result of Partial CRC appended with $(2^a+2^b)$ zero-bytes, wherein a=4 and b=3, according to Second Order Values of 16 and 8, the Fifteenth Code 94 is used in place of the Partial CRC by setting load1=0 to proceed the third iteration. In the third iteration, 1 ($2^0$) can be extracted from the First Order Value of 25 as the next Second Order Value, hence the symbol "a" in the FIG. 14 stands for 0 in the third iteration. By repeating the procedures conducted during clock cycle C1, C2, C3 and C4, the Fifteenth Code 94 for the Iteration 3 can be obtained. More specifically, it is the CRC calculating result of Partial CRC appended with $(2^a+2^b+2^c)$ zero-bytes, wherein a=4, b=3 and c=0, according to the Second Order Values of 16, 8 and 1 in the exemplary case. After all the Second Order Values, e.g. 16, 8 and 1, are extracted from the First Order Value. e.g. 25, the Fifteenth Code 94 generated in this iteration is regarded as the Adjusted CRC, and the Adjusting Phase of the second embodiment is finished.

Figure 17:
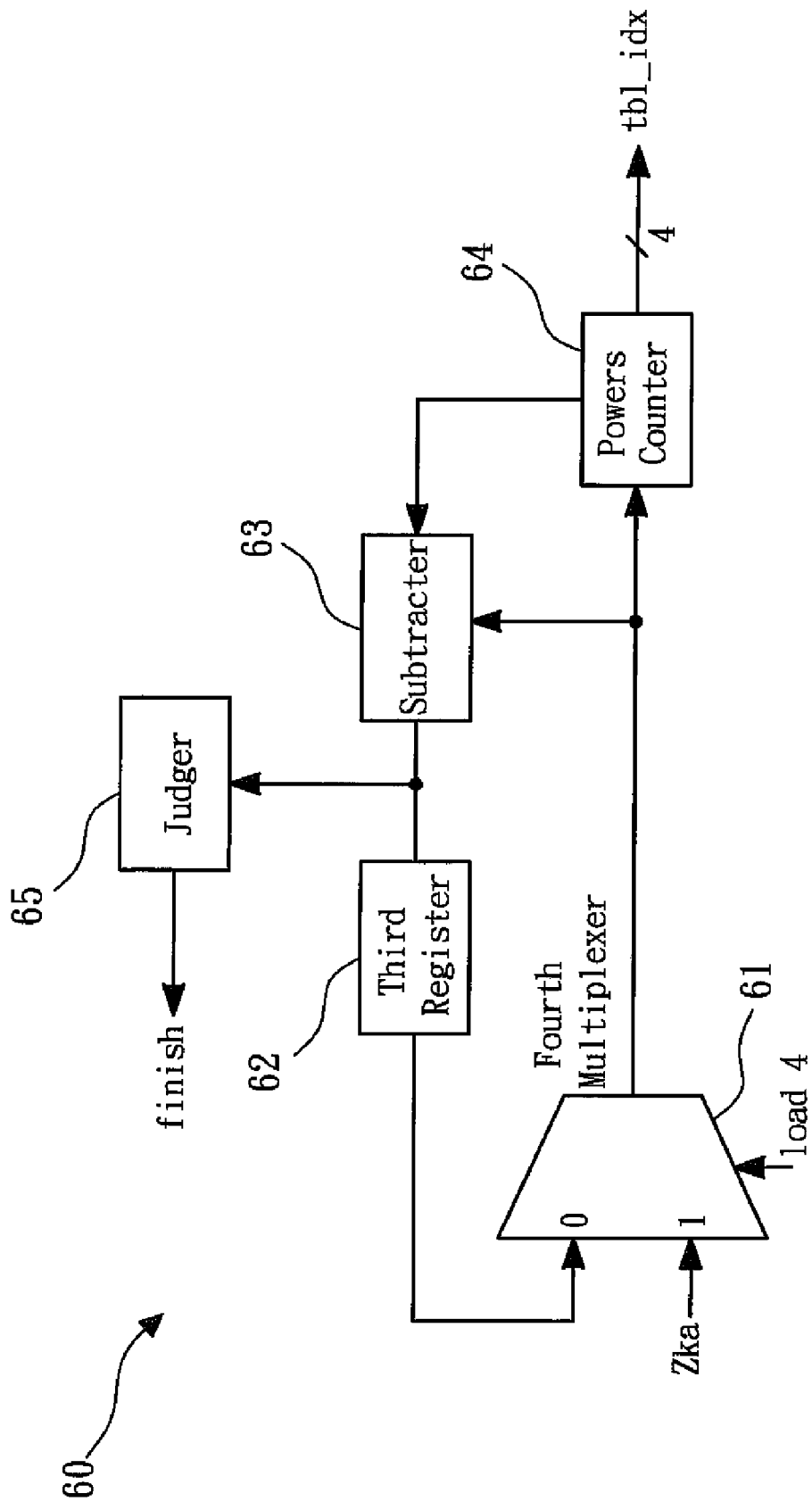
FIG. 17 is the schematic view of the numeric decomposing device according to the invention.

Referring to FIG. 17, it shows the schematic view of the Numeric Decomposing Device according to the invention. The Numeric Decomposing Device 60 comprises a Fourth Multiplexer 61, a Third Register 62, a Subtracter 63, a Powers Counter 64 and a Judger 65. The Fourth Multiplexer 61 is used for switching the decomposing value Zka and the intermediate decomposed value according to the fourth selecting signal load4. In the exemplary case, the decomposing value Zka is the First Order Value of 25. In the first iteration, the fourth selecting signal load4 to the Fourth Multiplexer 61 is set to 1 to let the decomposing value Zka be switched to the output of the Fourth Multiplexer and then be fed to Powers Counter 64.

The Powers Counter 64 is used for extracting the highest Second Order Value $2^a$ from its input and producing a and $2^a$ at its outputs. The produced a is then used as the first controlling signal tbl_idx while the produce $2^a$ is used in latter subtraction. In the exemplary case, the decomposing value Zka is the First Order Value of 25, hence its highest Second Order Value of $2^4$ is extracted by the Power Counter 64. Then 4 is used as the tbl_idx and the $2^4$ is fed into the Subtracter 63. The Subtracter 63 is used for subtracting the extracted Second Order Processing Value from the output of Fourth Multiplexer 61 to obtain an intermediate decomposed value. In the exemplary case, in Iteration 1 the First Order Value of 25 is switched to the output of Fourth Multiplexer 61 and the highest Second Order Value of 16 (24) is extracted by Power Counter 64, thus the intermediate decomposed value calculated by the Subtracter 63 in Iteration 1 is 9, i.e. 25-16. The intermediate decomposed value is registered in the Third Register 62 for next Iteration.

The Judger 65 is used for judging whether the intermediate decomposed value is zero. If the intermediate decomposed value is zero, a signal finish is set to 1 to state that the numeric decomposing calculation is finished and the current iteration is the last iteration required to generate the Adjusted CRC.

During the iteration other than the first iteration (Iteration 1), the fourth selecting signal load4 to the fourth multiplexer 61 is set to zero to let the intermediate decomposed value be switched to the output of the Fourth Multiplexer and then be fed to the input of the Powers Counter 64.

For example, during the Iteration 2 according to the exemplary case, the intermediate decomposed value is 9, thus the next Second Order Value of 8 and the tbl_idx of 3 can be produced by the Power Counter 64. Besides, the next intermediate decomposed value of 1 is produced by Subtracter 63 and is registered in the Third Register 62 for next Iteration.

As another example, during the Iteration 3 according to the exemplary case, the intermediate decomposed value is 1 as registered in Third Register 62, thus the next Second Order Value of 1 and the tbl_idx of 0 can be produced by the Power Counter 64. Besides, the next intermediate decomposed value of 0 is produced by Subtracter 63. Since the next intermediate decomposed value is 0, the Judger 65 set signal finish to 1 to state that the numeric decomposing calculation is finished and the current iteration is the last iteration required to generate the Adjusted CRC.

Based on the second embodiment, if the total length of the message is under 16 KB, then 14 KB Memory is sufficient to be used for the required table looking-up in consideration of the worst case whose Partial CRC is appended with 16383 (binary code is $11111111111111_2$.) zero-bytes.

The Third Embodiment

The second embodiment can be used to reduce the required Memory space to get the Adjusted CRC compared with the first embodiment. However, if the Memory resource of a target system is adequate, the third embodiment described below can be used to increase the efficiency of the second embodiment.

Figure 18:
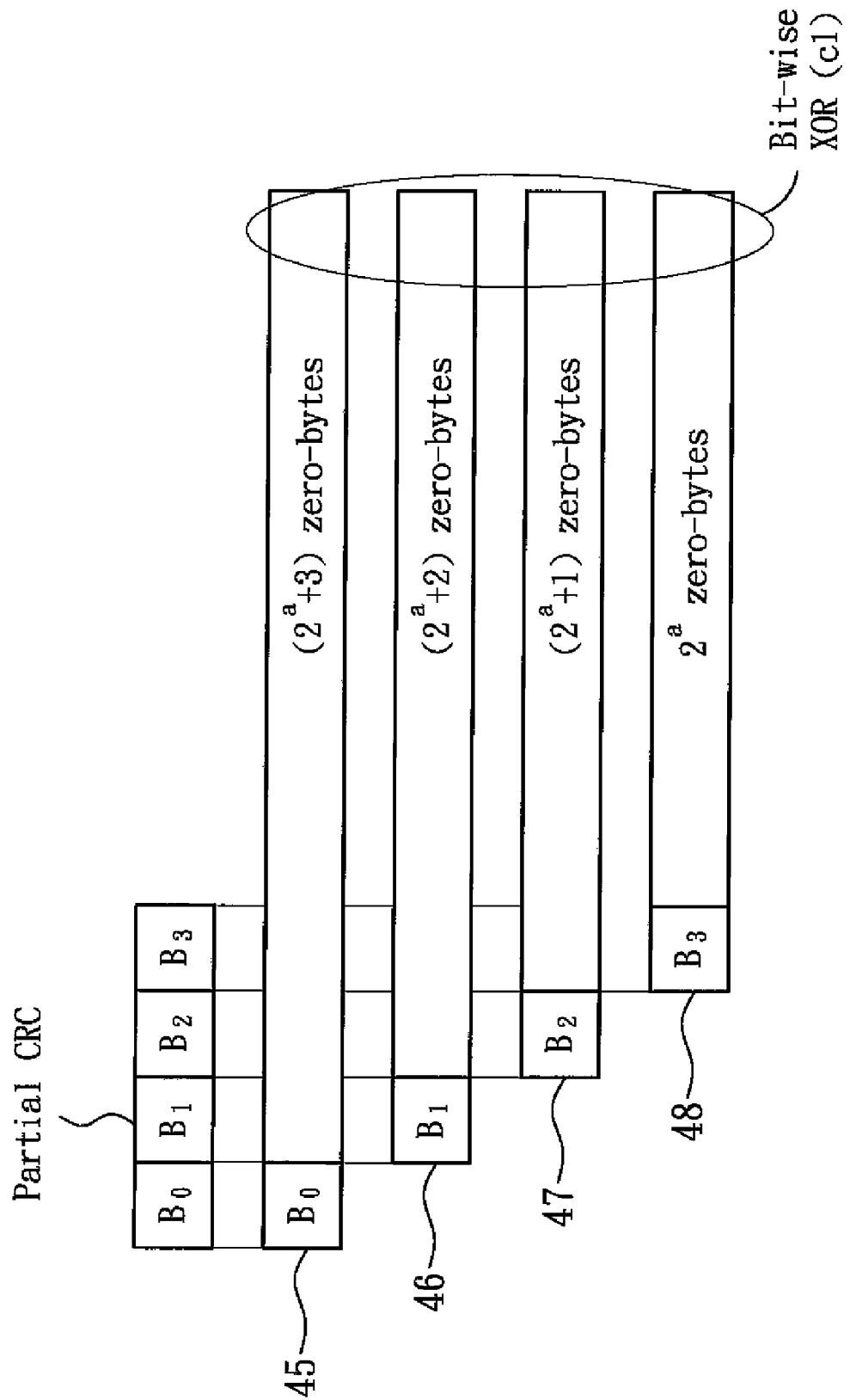
FIG. 18 is the schematic view of a plurality of Second Codes according to the third embodiment of the invention.

FIG. 18 shows the schematic view of a plurality of segments of Second Codes according to the third embodiment of the invention. The third embodiment still needs to decompose the First Order Value into Second Order Value(s) and get the Adjusted CRC in iterations according to the number of Second Order Value(s) decomposed. The First Order Value is the number of zero-bytes appended to the Partial CRC in the First Code. The First Order Value is decomposed into a plurality of Second Order Values according to the combination of powers of two. In the exemplary case, the First Order Value of 25 is decomposed to three Second Order Values of 16, 8 and 1 The Partial CRC ($B_0B_1B_2B_3$), is spread to a plurality of Second Codes. The Partial CRC ($B_0B_1B_2B_3$) has four sub-bytes, the sub-bytes are spread to the most significant bytes of the Second Codes respectively, the other bytes of the Second Codes are zero. A byte number of the zero-bytes is the Second Order Processing Value adding to a setting value.

Though the third embodiment still needs to decompose the First Order Value into Second Order Value(s) get the Adjusted CRC in iterations according to the number of Second Order Value (s) decomposed, however, only one clock cycle is required in each iteration due to using extra look-up tables.

Referring to FIG. 18, after got Second Order Value(s), each of the bytes of Partial CRC, e.g. $\{B_0, B_1, B_2, B_3\}$, can be appended with a number of zero-byte(s) according to the one of the Second Order Value(s). For example, $B_0$ appending with $2^a+3$ zero-bytes is regarded as Data 45; $B_1$ appending with 2a+2 zero-bytes is regarded as Data 46; $B_2$ appending with $2^a+_1$ zero-bytes is regarded as Data 47; $B_3$ appending with $2^a$ zero-bytes is regarded as Data 48. The CRC calculating result of Data 48 which is comprised of $2^a$ zero-bytes can be obtained by looking the Memory as same as second embodiment. The CRC calculating results of Data 45, Data 46 and Data 47 can be obtained by adding three extra look-up tables in order to complete an iteration in one clock cycle. In the embodiment, four second codes comprises the second code 45 with a first sub-byte ($B_0$), the second code 46 with a second sub-bytes ($B_1$), the second code 47 with a third sub-byte ($B_2$) and the second code 48 with a fourth sub-byte ($B_3$). The byte number of the zeroed-bytes of the second code 45 with a first sub-byte ($B_0$) is the second order processing value adding to three ($2^a+_3$). The byte number of the zeroed-bytes of the second code 46 with a second sub-byte ($B_1$) is the second order processing value adding to two ($2^a+2$). The byte number of the zeroed-bytes of the second code 47 with a third sub-byte ($B_2$) is the second order processing value adding to one ($2^a+1$). The byte number of the zeroed-bytes of the second code 48 with a fourth sub-byte ($B_3$) is the second order processing value adding to zero ($2^a$).

Figure 19:
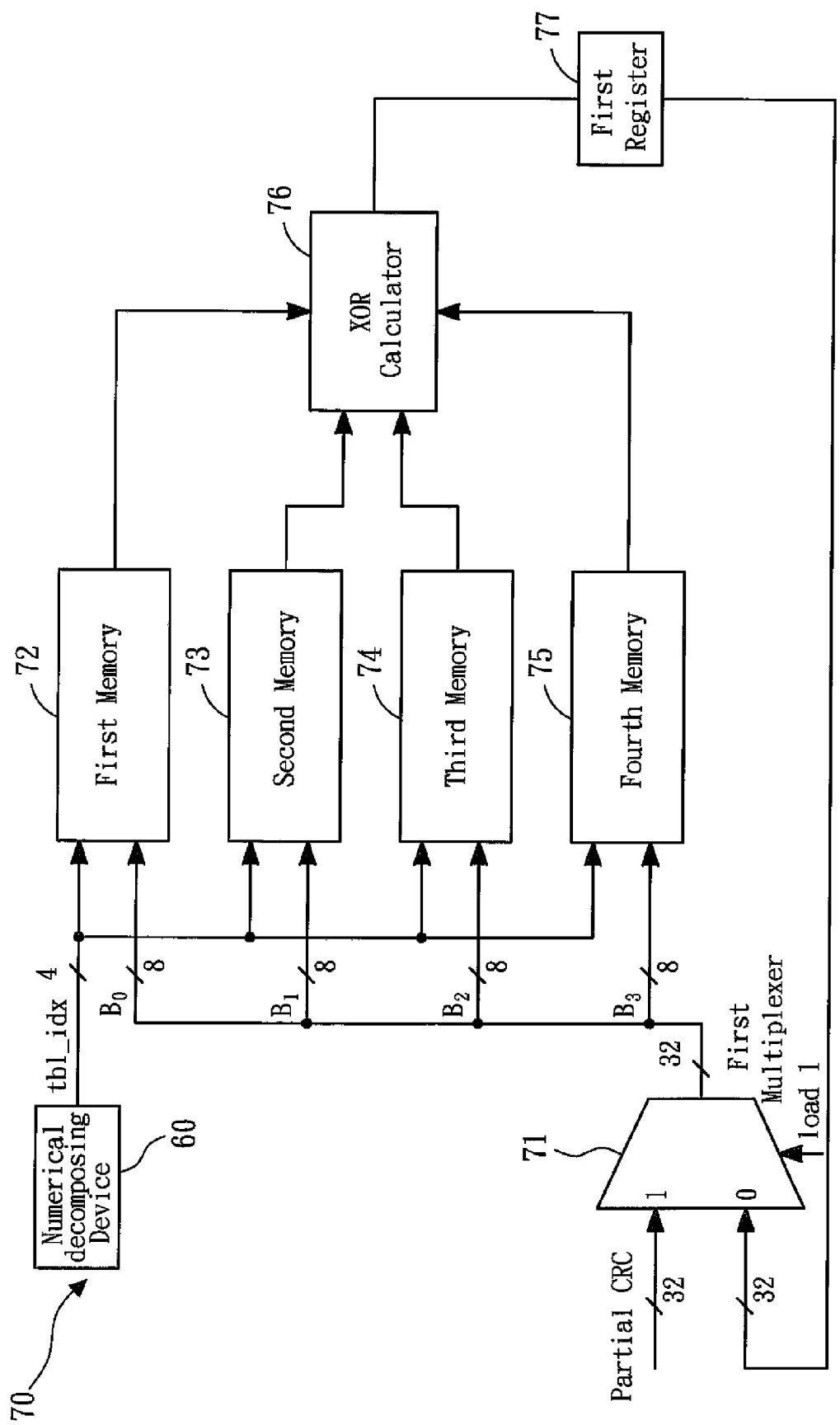
FIG. 19 is the schematic view of the Second Calculating Device according to the third embodiment of the invention.

Therefore, according to the exemplary case, Memories the third embodiment needs three extra 14 KB Memories in addition to the 14 KB Memory required by the second embodiment. More specifically, the three extra 14 KB Memories are used to deal with the CRC calculating of a byte appended with $2^a+1$, $2^a+2$, $2^a+3$ zero-bytes, where $0 \leq a \leq 13$), respectively. Referring to FIG. 19, the Second Calculating Device 70 of the third embodiment comprises a First Memory 72, a Second Memory 73, a Third Memory 74 and a Fourth Memory 75 according the exemplary case.

The first Memory 72 is used for storing the CRC calculating results of the Data 45, that is, the first Memory 72 can be used for look-up table to obtain the CRC calculating results of the Data 45 which is comprised of a byte appended with $2^a+3$ zero-bytes. The second Memory 73 can be used for look-up table to obtain the CRC calculating results of the Data 46 which is comprised of a byte appended with $2^a+2$ zero-bytes. The third Memory 74 can be used for look-up table to obtain the CRC calculating results of the Data 47 which is comprised of a byte appended with $2^a+1$ zero-bytes. The fourth Memory 75 can be used for look-up table to obtain the CRC calculating results of the Data 48 which is comprised of a byte appended with $2^a$ zero-bytes. In the third embodiment, since the Second Calculating Device 70 has four Memories to conduct table looking-up at the same clock cycle, only one clock is need to complete the operation of each iteration according to the decomposed Second Order Value (s).

Referring to FIG. 19 again, it shows the schematic view of the Second Calculating Device according to the third embodiment of the invention. The Second Calculating Device 70 comprises a Numerical Decomposing Device 60, a First Multiplexer 71, a plurality of Memories 72, 73, 74, 75, an XOR Calculator 76 and a First Register 77. The Numerical Decomposing Device 60 is used for decomposing a First Order Value into a sequence of Second Order Value (s) according to combination of powers of two as discussed. For example, a First Order Value of 25 can be decomposed into Second Order Values of 16, 8 and 1. The Numerical Decomposing Device 60 is used for decomposing a plurality of zero-bytes of the First Code, a byte number of the zero-bytes being a First Order Value, decomposing the First Order Value to a plurality of Second Order Values according to combination of power of two. The numerical decomposing device 60 can be referred in FIG. 17.

The First Multiplexer 71 is used for switching its output to either the Partial CRC or the intermediate calculating result from previous iteration according the first selecting signal load1. The first multiplexer 71 is used for receiving Partial CRC and an iteration calculating result, and for switching the Partial CRC or the iteration calculating result to an output of the First Multiplexer according to the first selecting signal. The Partial CRC and the iteration calculating result both have a plurality of sub-bytes.

Figure 13C:
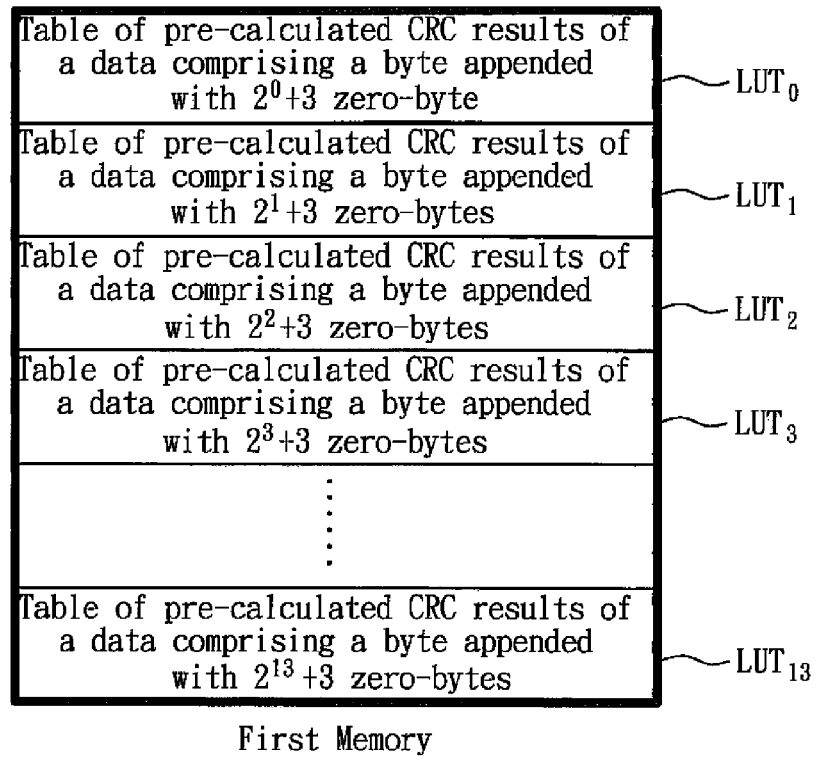
FIG. 13C is the schematic view of Memory arrangement according to the third embodiment of the invention.
Figure 1:
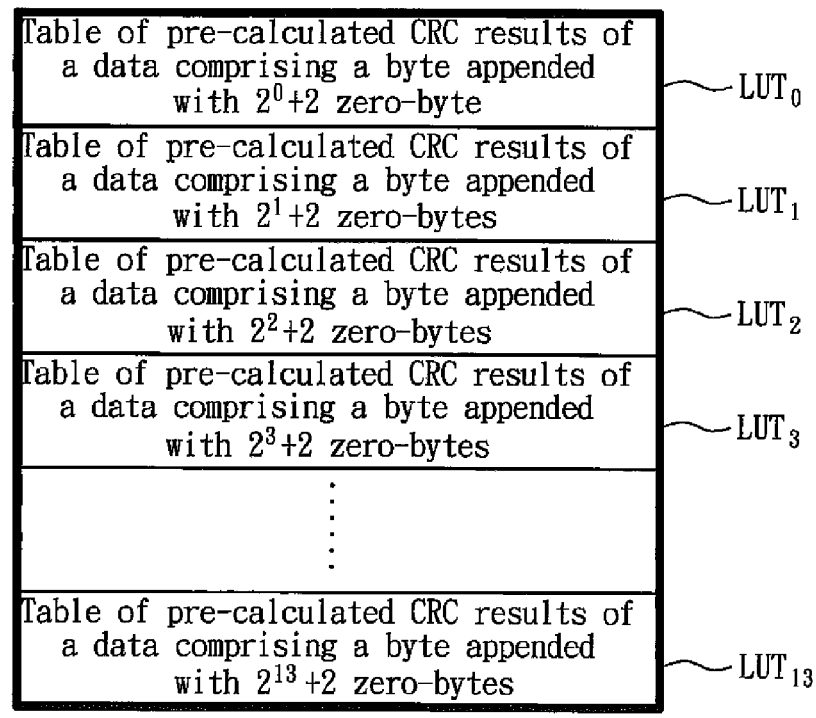
Figure 13C:
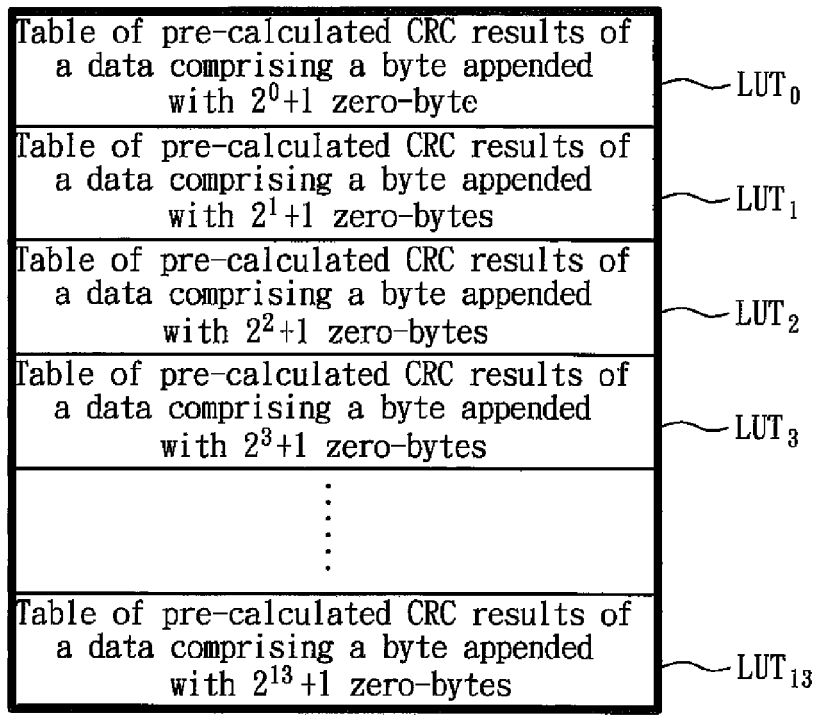
Figure 2:
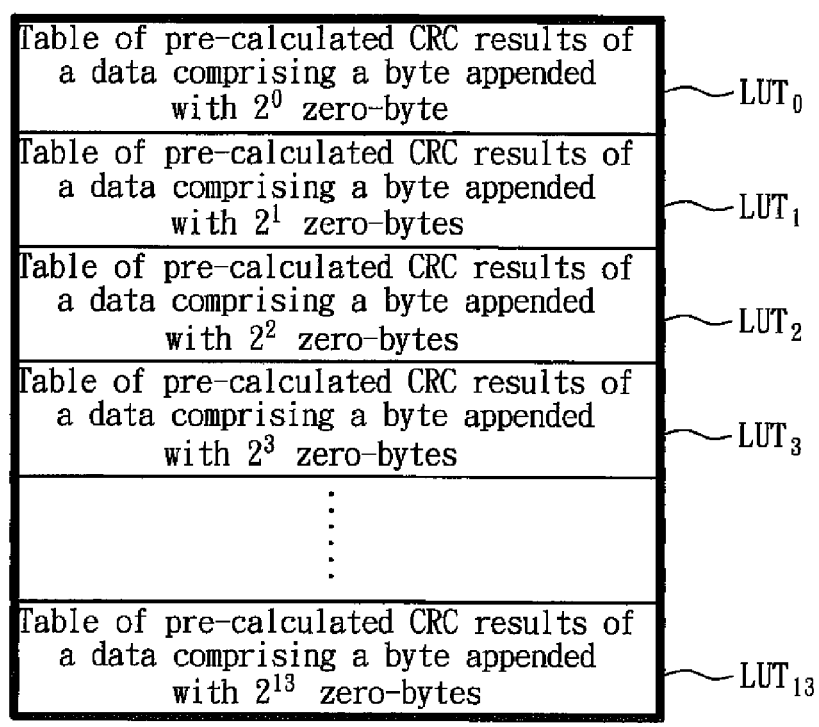

The Memory 75 storing blocks of look-up tables, i.e. $LUT_x$ where $x=2^a$ and $a=0\text{-}13$ for processing 16 KB iSCSI message is used for latter table looking-up. In addition to the Memory 75, the Memory 74 stores blocks of look-up tables, i.e. $LUT_x$ where $x=2^a+1$ and $a=0\text{~}13$; the Memory 73 stores blocks of look-up tables, i.e. $LUT_x$ where $x=2^a+2$ and $a=0\text{~}13$; the Memory 72 stores blocks of look-up tables, i.e. $LUT_x$ where $x=2^a+_3$ and $a=0\text{~}13$. The exemplary content of Memories 72, 73, 74, 75 can be referred in FIG. 13C.

The Memories 72, 73, 74, 75 are used for storing a plurality of Third Codes, and the Third Codes are CRC calculating result of the Second Codes. The most significant bytes of the Second Codes are the sub-bytes respectively, the other bytes of the Second Codes are set to zero. A byte number of the zero-bytes is a Second Order Processing Value adding a setting value. The Third Codes can be obtained according to the Second Codes. The XOR Calculator 76 is used for merging the results outputted from the four Memories by XOR operation to obtain intermediate calculating result of each iteration. The First Register 77 is used for storing the intermediate calculating result and the registered intermediate calculating result is routed back to the First Multiplexer 71 for next iteration.

Referring to FIG. 19, the third embodiment is implemented by an exemplary hardware circuit.

In the first iteration (Iteration1) the first selecting signal load1 of the First Multiplexer 71 is set to 1 to let the Partial CRC be switched to the output of the First Multiplexer 71. Then each of the bytes of the Partial CRC, e.g. byte $B_0$, byte $B_1$, byte $B_2$ and byte $B_3$, are assigned to Memory 72, Memory 73, Memory 74 and Memory 75 respectively. The numeric decomposing device 60 extracts the first Second Order Value $2^a$ from the First Order Value and ouputs "a" as the tbl_idx which is assigned to Memories 72, 73, 74 and 75 as the block index to each look-up table. For example, according to the exemplary case, 16 ($2^4$) is extracted from the First Order Value of 25, and 4 is used as the tbl_idx. Based on above address assignment to the Memory 72, 73, 74 and 75, four table looking-up results can be obtained and each of the four table looking-up results is regarded as the Third Codes in following description.

The intermediate calculating result of the first iteration can be simply got by using the XOR Calculator 76 to merge the four Third Codes. The First Register 77 is used for storing the intermediate calculating result of the first iteration and the registered intermediate calculating result is routed back to the First Multiplexer 71 for the next iteration. Therefore, in the third embodiment, only one clock is needed to complete the operation of calculating CRC in the first iteration.

In the second iteration (Iteration 2), the first selecting signal load 1 of the First Multiplexer 71 is set to zero to let the registered intermediate calculating result of the first iteration be switched to the output of the First Multiplexer 71. The four bytes of the registered intermediate calculating result are fed to the four Memories 72, 73, 74, 75. In Iteration 2, the Numeric Decomposing Device 60 extracts the second Second Order Value from the First Order Value of 25, e.g. 8 ($2^3$), according to the exemplary case. Hence the first controlling signal tbl_idx produced from the Numeric Decomposing Device 60 is set to 3. With the registered intermediate calculating result and the tbl_idx as the address to the four Memories, four Third Codes for the Iteration 2 can be found at the outputs of the four Memories respectively. The intermediate calculating result of the Iteration 2 can be obtained by using the XOR Calculator 76 to merge the four Third Codes are merged. The First Register 77 is used for storing the intermediate calculating result of the Iteration 2 and the registered intermediate calculating result is routed back to the First Multiplexer 71 for the next iteration.

In the third iteration (Iteration 3), the first selecting signal load 1 of the First Multiplexer 71 is set to zero to let the registered intermediate calculating result of the second iteration be switched to the output of the First Multiplexer 71. The four bytes of the registered intermediate calculating result are fed to the four Memories 72, 73, 74, 75. In Iteration 3, the Numeric Decomposing Device 60 extracts the third Second Order Value from the First Order Value of 25, e.g. 1 ($2^0$), according to the exemplary case. Hence the first controlling signal tbl_idx produced from the Numeric Decomposing Device 60 is set to 0. With the registered intermediate calculating result and the tbl_idx as the address to the four Memories, four Third Codes for the Iteration 3 can be found at the outputs of the four Memories respectively. The intermediate calculating result of the Iteration 3 can be obtained by using the XOR Calculator 76 to merge the four Third Codes are merged. The First Register 77 is used for storing the intermediate calculating result of the Iteration 3. The registered intermediate calculating result is the Adjusted CRC, since all the Second Order Values, e.g. 16, 8 and 1, are extracted according to the exemplary case.

The first controlling signal tbl_idx can be controlled by the Numeric Decomposing Device 60 in FIG. 17. Based on the third embodiment, if the total length of the message is under 16 KB, four 14 KB (totally 56 KB) Memories are sufficient to be used for the required table looking-up in consideration of the worst case whose Partial CRC is appended with 16383 (binary code is $11111111111111_2$.) zero-bytes.

As considering the efficiency of implementation, the method of the three embodiments in the invention can complete the calculations of Adjusting Phase within 1 clock cycles, 56 clock cycles and 14 clocks according to the first embodiment, the second embodiment and the third embodiment respectively. As the detailed exemplary implementation described above, the system and method of the invention can easily be applied for the high speed CRC applications over internet to insure both the data correctness and the high performance.

As several embodiments of the present invention have been illustrated and described, various modifications and improvements can be made by those skilled in the art. The embodiment of the present invention is therefore described in an illustrative, but not restrictive, sense. It is intended that the present invention may not be limited to the particular forms as illustrated, and that all modifications which maintain the spirit and scope of the present invention are within the scope as defined in the appended claims.

What is claimed is:

1. A method for calculating CRC, comprising the steps of:
    calculating a Partial CRC from a segment of a message, using a First Calculating Device;
    generating a First Code, using a First Code generating device, the First Code comprising the Partial CRC, other bits of the First Code set to zero; and
    spreading a plurality of Second Codes from the First Code, obtaining a plurality of Third Codes according to the Second Codes, the Third Codes being a CRC calculation result of the Second Codes, multiplexing the Partial CRC and an iteration calculating result according to a first selecting signal and XOR calculating the Third Codes to obtain an Adjusted CRC, using a Second Calculating Device.

2. The method according to claim 1, wherein the Partial CRC comprises a plurality of sub-bytes, the sub-bytes spreading to the most significant bytes of the Second Codes respectively, other bytes of the Second Codes set to zero.

3. The method according to claim 2, further comprising a table looking-up step and a XOR calculating step, for obtaining the plurality of Third Codes from at least one Memory according to the Second Codes, using at least one Memory; and for XOR calculating the Third Codes to obtain the Adjusted CRC, using a XOR Calculating Device.

4. The method according to claim 3, wherein the Memory comprises a plurality of blocks, each block stores a plurality of pre-computed CRC result corresponding to one sub-byte.

5. The method according to claim 3, further comprising the steps of:
  decomposing a plurality of zero-bytes of the First Code, a byte number of the zero-bytes being a First Order Value, decomposing the First Order Value to a plurality of Second Order Values according to combination of power of two, using a Numerical Decomposing Device;
  obtaining a Second Order Processing Value from the Second Order Values from high to low, and spreading the plurality of Second Codes from the Partial CRC, the Partial CRC comprising a plurality of sub-bytes, the sub-bytes spreading to the most significant bytes of the Second Codes respectively, other bytes of the Second Codes set to zero, a byte number of the zero-bytes being the Second Order Processing Value adding to a setting value;
  obtaining the plurality of Third Codes from at least one Memory according to the Second Codes;
  XOR calculating the Third Codes to obtain the iteration calculating result, using a XOR Calculator, and replacing the Partial CRC by the iteration calculating result, using a First Register; and
  repeating the above spreading step, table looking-up step and XOR calculating step to the lowest Second Order Processing Value, the iteration calculating result being the Adjusted CRC.

6. The method according to claim 5, wherein the Partial CRC comprises four sub-bytes, the four sub-bytes are spread respectively to the most significant bytes of four Second Codes, four byte numbers of the zero-bytes of four Second Codes are respectively the Second Order Processing Value adding three, the Second Order Processing Value adding two, the Second Order Processing Value adding one and the Second Order Processing Value adding zero.

7. The method according to claim 6, wherein the table looking-up step uses four Memories, the four Memories store pre-computed CRC results corresponding to four Second Codes respectively.

8. The method according to claim 1, further comprising the steps of:
  decomposing a plurality of zero-bytes of the First Code, a byte number of the zero-bytes being a First Order Value, decomposing the First Order Value to a plurality of Second Order Values according to combination of power of two;
  obtaining a Second Order Processing Value from the Second Order Values from high to low,
  switching to obtain the Partial CRC or the iteration calculating result according to a first selecting signal, the Partial CRC and the iteration calculating result both comprise a plurality of sub-bytes;
  switching to obtain one of the sub-bytes according to a second selecting signal;
  obtaining a Third Code from at least one Memory according to the selected sub-byte and Second Order Processing Value, the most significant bytes of the Second Code being the selected sub-byte, other bytes of the Second Code being zero, a byte number of the zero-bytes being the Second Order Value;
  switching the Third Code or a XOR calculating result to be a first intermediate CRC calculating result according to a third selecting signal;
  appending a zero-byte after the first intermediate CRC calculating result, then calculating CRC to obtain a second intermediate CRC calculating result;
  calculating XOR of the Third Code and the second intermediate CRC calculating result to obtain the XOR calculating result;
  controlling whether the first intermediate CRC calculating result output as the iteration calculating result according to an enable signal;
  repeating all steps after the above step of switching to obtain one of the sub-bytes, from high byte to low byte, until obtaining the lowest byte of the sub-bytes; and
  repeating all steps after the above step of obtaining the Second Order Processing Value, from high value to low value, until obtaining the lowest value of the Second Order Value, the iteration calculating result being the Adjusted CRC.

9. The method according to claim 8, wherein the number of the Second Order Value determines an iteration calculating value, in a first iteration calculation, the first selecting signal is used to switch to obtain the Partial CRC; in other iteration calculation, the first selecting signal is used to switch to obtain the iteration calculating result.

10. The method according to claim 9, wherein the Partial CRC and the iteration calculation result both have four sub-bytes, from high byte to low byte, in a first clock, the second selecting signal is used to switch to obtain a first sub-byte; in a second clock, the second selecting signal is used to switch to obtain a second sub-byte; in a third clock, the second selecting signal is used to switch to obtain a third sub-byte; in a fourth clock, the second selecting signal is used to switch to obtain a fourth sub-byte.

11. The method according to claim 10, wherein the first clock in every iteration calculation, the third selecting signal is used to switch the first intermediate CRC calculating result being the Third Code; in other clocks in every iteration calculation, the third selecting signal is used to switch the first intermediate CRC calculating result being the XOR calculating result.

12. The method according to claim 11, wherein the fourth clock in every iteration calculation, the enabling signal controls the first intermediate CRC calculating result to output as the iteration calculating result.

13. The method according to claim 3, further comprising the steps of:
  decomposing a plurality of zero-bytes of the First Code, a byte number of the zero-bytes being a First Order Value, decomposing the First Order Value to a plurality of Second Order Values according to combination of power of two;
  obtaining a Second Order Processing Value from the Second Order Values from high to low, and spreading the plurality of Second Codes from the Partial CRC, the Partial CRC comprising a plurality of sub-bytes, the sub-bytes spreading to the most significant bytes of the Second Codes respectively, other bytes of the Second Codes set to zero, a byte number of the zero-bytes being the Second Order Processing Value;
  obtaining a Second Code having a first sub-byte from the Second Codes according to the alignment of the sub-bytes, and obtaining a Third Code from at least one Memory according to the Second Code having the first sub-byte, the Third Code being a CRC calculating result of the Second Code having the first sub-byte;
  obtaining a Second Code having a second sub-byte from the Second Codes, and obtaining a Fourth Code from the Memory according to the Second Code having the second sub-byte, the Fourth Code being a CRC calculating result of the Second Code having the second sub-byte; calculating a Fifth Code, the lowest byte of the Fifth Code being zero-byte, other bytes of the Fifth Code being the Third Code, a CRC calculating result of the Fifth Code being a Sixth Code, XOR calculating the Fourth Code and the Sixth Code to obtain a Seventh Code;

obtaining a Second Code having a third sub-byte from the Second Codes, and obtaining an Eighth Code from the Memory according to the Second Code having the third sub-byte, the Eighth Code being CRC calculating result of the Second Code having the third sub-byte; calculating a Ninth Code, the lowest byte of the Ninth Code being zero-byte, other bytes of the Ninth Code being the Seventh Code, a CRC calculating result of the Ninth Code being a Tenth Code, XOR calculating the Eighth Code and the Tenth Code to obtain an Eleventh Code;

obtaining a Second Code having a fourth sub-byte from the Second Codes, and obtaining a Twelfth Code from the Memory according to the Second Code having the fourth sub-byte, the Twelfth Code being CRC calculating result of the Second Code having the fourth sub-byte; calculating a Thirteenth Code, the lowest byte of the Thirteenth Code being zero-byte, other bytes of the Thirteenth Code being the Eleventh Code, a CRC calculating result of the Thirteenth Code being a Fourteenth Code, XOR calculating the Twelfth Code and the Fourteenth Code to obtain a Fifteenth Code, using the Fifteenth Code to replace the Partial CRC; and repeating the above spreading step, table looking-up step and XOR calculating step, to the lowest Second Order Processing Value, the Fifteenth Code being the Adjusted CRC.

14. A system for calculating CRC, comprising: a First Calculating Device, for calculating a Partial CRC from a segment of a message;
 a First Code generating device, for generating a First Code, the First Code comprising the Partial CRC, other bits of the First Code set to zero; and
 a Second Calculating Device, for spreading a plurality of Second Codes from the First Code, obtaining a plurality of Third Codes according to the Second Codes, the Third Codes being a CRC calculation result of the Second Codes, multiplexing the Partial CRC and an iteration calculating result according to a first selecting signal and XOR calculating the Third Codes to obtain an Adjusted CRC.

15. The system according to claim 14, wherein the second calculating device comprises a Spreading Device for spreading the plurality of Second Codes from the First Code, the Partial CRC comprising a plurality of sub-bytes, the sub-bytes spreading to the most significant bytes of the Second Codes respectively, other bytes of the Second Codes set to zero.

16. The system according to claim 15, wherein the Second Calculating Device further comprises a Third Calculating Device and a XOR Calculating Device, the Third Calculating Device is used for calculating CRC respectively according to the Second Codes to obtain the plurality of Third Codes; and the XOR Calculating Device is used for XOR calculating the Third Codes to obtain the Adjusted CRC.

17. The system according to claim 15, wherein the Second Calculating Device further comprises at least one Memory and a XOR Calculating Device, a plurality of Third Codes are obtained from the Memory according to the Second Codes, the Third Codes are CRC calculating result of the Second Codes; the XOR Calculating Device is used for XOR calculating the Third Codes to obtain the Adjusted CRC.

18. The system according to claim 17, wherein the Memory comprises a plurality of blocks, each block stores a plurality of pre-computed CRC result corresponding to a sub-byte.

19. The system according to claim 14, wherein the Second Calculating Device further comprises:
 a Numerical Decomposing Device, for decomposing a plurality of zero-bytes of the First Code, a byte number of the zeroed-bytes being a First Order Value, decomposing the First Order Value to a plurality of Second Order Values according to combination of power of two;
 a First Multiplexer, for receiving the Partial CRC and the iteration calculating result, for switching the Partial CRC or the iteration calculating result to an output of the First Multiplexer according to a first selecting signal, the Partial CRC and the iteration calculating result both having a plurality of sub-bytes;
 a plurality of Memories, for storing plurality of Third Codes, the most significant bytes of the Second Codes being the sub-bytes respectively, other bytes of the Second Codes set to zero, a byte number of the zero-bytes being a Second Order Processing Value adding a setting value; obtaining a plurality of Third Codes according to the Second Codes;
 a XOR Calculator, for XOR calculating the Third Codes from the Memories to obtain the iteration calculating result; and
 a First Register, for storing the iteration calculating result, and outputting to the First Multiplexer.

20. The system according to claim 19, wherein the Partial CRC and the iteration calculating result both comprise four sub-bytes, the four sub-bytes are spread respectively to the most significant bytes of four Second Codes, four byte numbers of the zero-bytes of four Second Codes are respectively the Second Order Processing Value adding three, the Second Order Processing Value adding two, the Second Order Processing Value adding one and the Second Order Processing Value adding zero.

21. The system according to claim 20, wherein the Second Calculating Device comprises four Memories, four Memories store pre-computed CRC results corresponding to four Second Codes respectively.

22. The system according to claim 19, wherein the number of the Second Order Value determines an iteration calculating value, in a first iteration calculation, the first selecting signal is used to switch the output of the First Multiplexer being the Partial CRC; in other iteration calculating, the first selecting signal is used to switch the output of the First Multiplexer being the iteration calculating result.

23. The system according to claim 19, wherein the Numerical Decomposing Device comprises:
 a Fourth Multiplexer, for receiving the First Order Value and an intermediate decomposed value, for switching the First Order Value or the intermediate decomposed value to the output of the Fourth Multiplexer as a processed value according to the fourth selecting signal;
 a Powers Counter, for obtaining the highest power number of power of two and its value of the processed value, the value is the Second Order Processing Value;
 a Subtracter, for subtracting the Second Order Processing Value from the processed value, to obtain an intermediate decomposed value;
 a Judger, for judging whether the intermediate decomposed value is zero; and
 a Third Register, for storing the intermediate decomposed value, and outputting to the Fourth Multiplexer.

24. The system according to claim 23, wherein the number of the Second Order Value determines an iteration calculating value, in a first iteration calculating, the fourth selecting signal is used to switch the processed value being the First Order Value; in other iteration calculating, the fourth selecting signal is used to switch the processed value being the intermediate decomposed value.

25. The system according to claim 14, wherein the Second Calculating Device further comprises:
- a Numerical Decomposing Device, for decomposing a plurality of zeroed- bytes of the First Code, a byte number of the zero-bytes being a First Order Value, decomposing the First Order Value to a plurality of Second Order Values according to combination of power of two;
- a First Multiplexer, for receiving the Partial CRC and the iteration calculating result, for switching the Partial CRC or the iteration calculating result to an output of the First Multiplexer according to a first selecting signal, the Partial CRC and the iteration calculating result both having a plurality of sub-bytes;
- a Second Multiplexer, for receiving the sub-bytes, switching one of the sub-bytes to an output of the Second Multiplexer according to a second selecting signal;
- at least one Memory, for storing the plurality of Third Codes, the most significant bytes of the Second Codes being the sub-bytes respectively, other bytes of the Second Codes set to zero, a byte number of the zero-bytes being the Second Order Value;
- a Third Multiplexer, for receiving the Third Code and a XOR calculating result, switching the Third Code or XOR calculating result to an output of the Third Multiplexer as a first intermediate CRC calculating result according to a third selecting signal;
- a First Register, for storing the first intermediate CRC calculating result;
- an Appending-One-Zero-Byte CRC Calculator, for appending a zero-byte after the first intermediate CRC calculating result, for CRC calculating to obtain a second intermediate CRC calculating result;
- a XOR Calculator, for XOR calculating the Third Codes and the second intermediate CRC calculating result to obtain the XOR calculating result and output to the Third Multiplexer; and
- a Second Register, for storing the first intermediate CRC calculating result, and by an enabling signal to control whether the first intermediate CRC calculating result output to the First Multiplexer as the iteration calculating result.

26. The system according to claim 25, wherein the Numerical Decomposing Device comprises:
- a Fourth Multiplexer, for receiving the First Order Value and an intermediate decomposed value, for switching the First Order Value or the intermediate decomposed value to the output of the Fourth Multiplexer as a processed value according to the fourth selecting signal;
- a Powers Counter, for obtaining the highest power number of power of two and its value of the processed value, the value is the Second Order Processing Value;
- a Subtracter, for subtracting the Second Order Processing Value from the processed value, to obtain an intermediate decomposed value;
- a Judger, for judging whether the intermediate decomposed value is zero; and
- a Third Register, for storing the intermediate decomposed value, and outputting to the Fourth Multiplexer.

27. The system according to claim 26, wherein the number of the Second Order Value determines an iteration calculating value, in a first iteration calculating, the fourth selecting signal is used to switch the processed value as the First Order Value; in other iteration calculating, the fourth selecting signal is used to switch the processed value as the intermediate decomposed value.

28. The system according to claim 25, wherein the number of the Second Order Value determines an iteration calculating value, in a first iteration calculating, the first selecting signal is used to switch the output of the First Multiplexer being the Partial CRC; in other iteration calculating, the first selecting signal is used to switch the output of the First Multiplexer being the iteration calculating result.

29. The system according to claim 28, wherein the Partial CRC and the iteration calculation result both have four sub-bytes, the four sub-bytes output to the Second Multiplexer, in a first clock, the second selecting signal is used to switch the output of the Second Multiplexer being a first sub-byte; in a second clock, the second selecting signal is used to switch the output of the Second Multiplexer being a second sub-byte; in a third clock, the second selecting signal is used to switch the output of the Second Multiplexer being a third sub-byte; in a fourth clock, the second selecting signal is used to switch the output of the Second Multiplexer being a fourth sub-byte.

30. The system according to claim 29, wherein the first clock in every iteration, the third selecting signal is used to switch the first intermediate CRC calculating result of the Third Multiplexer being the Third Code; in other clocks in every iteration, the third selecting signal is used to switch the first intermediate CRC calculating result of the Third Multiplexer being the XOR calculating result.

31. The system according to claim 30, wherein the fourth clock in every iteration calculation, the enabling signal controls the first intermediate CRC calculating result to output to the First Multiplexer as the iteration calculating result.

* * * * *